(12) United States Patent  (10) Patent No.: US 9,107,306 B2
Nakatani et al.  (45) Date of Patent: Aug. 11, 2015

(54) HYBRID SUBSTRATE, METHOD FOR MANUFACTURING THE SAME, AND SEMICONDUCTOR INTEGRATED CIRCUIT PACKAGE

(75) Inventors: Seiichi Nakatani, Osaka (JP); Koji Kawakita, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 116 days.

(21) Appl. No.: 13/879,139

(22) PCT Filed: Oct. 5, 2011

(86) PCT No.: PCT/JP2011/005609
§ 371 (c)(1),
(2), (4) Date: Apr. 12, 2013

(87) PCT Pub. No.: WO2012/049822
PCT Pub. Date: Apr. 19, 2012

(65) Prior Publication Data
US 2013/0200516 A1 Aug. 8, 2013

(30) Foreign Application Priority Data
Oct. 14, 2010 (JP) ................................. 2010-231250

(51) Int. Cl.
*H05K 1/03* (2006.01)
*H01L 23/15* (2006.01)
(Continued)

(52) U.S. Cl.
CPC .......... *H05K 1/0306* (2013.01); *H01L 21/4857* (2013.01); *H01L 23/15* (2013.01); *H01L 23/49811* (2013.01); *H05K 3/107* (2013.01); *H05K 3/4605* (2013.01); *H01L 23/49822* (2013.01); *H01L 23/49827* (2013.01); *H01L 2224/16225* (2013.01);
(Continued)

(58) Field of Classification Search
CPC ... H05K 1/0306; H05K 3/107; H05K 3/4605; H01L 21/4857; H01L 23/49811; H01L 23/15
USPC ......................................................... 257/737
See application file for complete search history.

(56) References Cited

U.S. PATENT DOCUMENTS 4,998,159 A * 3/1991 Shinohara et al. ............ 361/809
6,153,290 A * 11/2000 Sunahara ...................... 428/210
(Continued)

FOREIGN PATENT DOCUMENTS

JP 59-111225 6/1984
JP 62-241391 10/1987
(Continued)

OTHER PUBLICATIONS

International Preliminary Report on Patentability issued Apr. 18, 2012 in International Application No. PCT/JP2011/005609.

*Primary Examiner* — Ermias Woldegeorgis
(74) *Attorney, Agent, or Firm* — Wenderoth, Lind & Ponack, LLP

(57) ABSTRACT

A hybrid substrate includes a core layer composed of a glass woven cloth as a reinforcing material, and a glass-ceramic sintered body which at least has a glass component and a metal oxide component. The glass woven cloth and the glass-ceramic sintered body formed by an impregnation with respect to the glass woven cloth are in a form of sintering integration with each other.

5 Claims, 13 Drawing Sheets

(51) Int. Cl.
*H05K 3/46* (2006.01)
*H05K 3/10* (2006.01)
*H01L 21/48* (2006.01)
*H01L 23/498* (2006.01)
*H05K 3/00* (2006.01)

(52) U.S. Cl.
CPC ............... *H01L 2924/09701* (2013.01); *H01L 2924/12044* (2013.01); *H05K 3/0097* (2013.01); *H05K 2201/029* (2013.01); *H05K 2203/1126* (2013.01)

(56) References Cited

U.S. PATENT DOCUMENTS

| | | |
|---|---|---|
| 6,846,549 B2 | 1/2005 | Tani et al. |
| 8,016,967 B2 | 9/2011 | Saito |
| 2001/0023779 A1* | 9/2001 | Sugaya et al. ............ 174/255 |
| 2002/0182958 A1 | 12/2002 | Tani et al. |
| 2010/0035033 A1 | 2/2010 | Saito |

FOREIGN PATENT DOCUMENTS

| | | |
|---|---|---|
| JP | 1-312886 | 12/1989 |
| JP | 9-153666 | 6/1997 |
| JP | 2002-319764 | 10/2002 |
| JP | 2005-39217 | 2/2005 |
| WO | 2009/087845 | 7/2009 |

\* cited by examiner

Present Invention

Before impregnation

After impregnation

HYBRID SUBSTRATE, METHOD FOR MANUFACTURING THE SAME, AND SEMICONDUCTOR INTEGRATED CIRCUIT PACKAGE

TECHNICAL FIELD

The present invention relates to a hybrid substrate, a manufacturing method for the hybrid substrate, and also a semiconductor integrated circuit package. More particularly, the present invention relates to a hybrid substrate whose core layer is made of different materials, and also a method for manufacturing such hybrid substrate. The present invention also relates to a semiconductor integrated circuit package which is obtainable from the hybrid substrate.

BACKGROUND OF THE INVENTION

With the development of the electronic equipment, a semiconductor integrated circuit employed in a CPU of a computer and a digital television has been improved in terms of its processing speed. Particularly, an image processing LSI is developing in terms of an increasing processing speed, and also a further integration is advanced. There is also a demand for a down-sizing and an increase in the number of I/O terminals.

Under such a current situation that the down-sizing and the increase in the number of I/O terminals is coincidentally developing, the down-sizing of terminal pitches and/or narrower pitching of the terminals is further developing, which causes a difficulty in a mounting of a semiconductor integrated circuit (i.e., LSI) on a packaged circuit board.

As a packaged circuit board of the LSI, a build-up wiring board is generally used wherein a plurality of build-up layers are laminated, each build-up layer comprising an interlayer insulator, a via hole, and a copper foil wiring layer on both sides of a core substrate having a high elastic modulus (for example, Patent Document 1 discloses that the core material of the build-up substrate has 100 times as high elastic modulus as that of the build-up layer thereof).

Particularly as for the latest CPU, miniaturization thereof is developing to the extent of 22 nm, and the increase in the number of I/O terminals and the scaling up of circuits are also remarkably developing. For a server use, the semiconductor integrated circuit chip is rather becoming larger. In the course of more use of large-sized chips, such a problem may arise that a solder connection can come off the substrate due to a substrate warpage occurred during a manufacturing process thereof, or due to a substrate warpage attributed to a thermal history upon a LIS chip mounting process even in a case where the normal build-up substrate is used.

On the other hand, a ceramic substrate with an excellent thermal conductivity may be used as a circuit board for LSI chip mounting. The ceramic substrate is excellent in terms of a heat resistance and a moisture resistance. The ceramic substrate also has a small thermal expansion coefficient and a less warpage characteristic. Thus, the ceramic substrate is suitable for a metal connection such as soldering. However, it is hard for the ceramic substrate to be sintered in a case where it has a large size. Further, a cracking tends to occur in the ceramic substrate, and thus the ceramic substrate is not suitable for a thinning of the substrate (see Patent Document 2).

The warpage and cracking of the substrate tend to more frequently occur when the size of the ceramic substrate becomes larger. In this point of view, the current ceramic substrate is provided in a size of about 100 mm square. Even if a large ceramic substrate is provided by a sintering process, such large ceramic substrate tends to be cracked with ease, and thereby a handling thereof becomes very difficult. Therefore, a hard substrate has to be realized only with a larger thickness thereof.

Recently, there has been proposed a composite substrate with its core substrate built up, in which a ceramic substrate is disposed in an opening of a core portion (core) of a build-up substrate, and also a resin material is provided on both sides thereof. For example, Patent Document 3 discloses that a ceramic portion is disposed in a region provided in a core substrate of a polymer material. In this prior art of Patent Document 3, a ceramic plate having a small thermal expansion coefficient is disposed in the opening of the core substrate to relax a difference in thermal expansion between a semiconductor and the polymer material, and thereby a disconnection therebetween is avoided.

PATENT DOCUMENT 1: JP 2002-319764
PATENT DOCUMENT 2: WO 2009/087845
PATENT DOCUMENT 3: JP 2005-039217

In a case where a large-sized semiconductor bare chip is mounted on a build-up substrate, it is very hard to avoid an influence of the warpage generated at a point in process time before and after the mounting of the semiconductor bare chip on the substrate. In this case, the ceramic substrate having a high elastic modulus is effectively used to avoid the above influence. The ceramic substrate with its high elastic modulus is desirable for a manufacturing of the build-up substrate. However, there is a difference in size between the ceramic substrate and the build-up substrate. For example, the ceramic substrate has a size of about 100 mm×about 100 mm, whereas a printed circuit board, which is a typical build-up substrate, has a size of about 340 mm×about 510 mm. Such size difference has a negative influence on the manufacture of the build-up substrate. Specifically, the manufacturing of the build-up substrate is substantially affected by the size of the ceramic substrate, which is not sufficient in terms of productivity. Particularly, since the ceramic substrate has a "small size" of about 100 mm square, the build-up substrate using such ceramic substrate should be manufactured based on such a small size unit, which inhibits a high productivity of the build-up substrate.

In this point, although an attempt can be made to increase the size of the ceramic substrate, a mere increase of the size of the ceramic substrate may induce a cracking or breaking of the substrate as mentioned above. The avoidance of the cracking or breaking may cause a difficulty in conveyance of the substrate during the production process of the substrate, or may require too large thickness of the substrate. A setter plate for a sintering process to be used in the manufacture of a large-sized ceramic substrate is usually difficult to be produced. Even if such setter plate is produced, it will become very expensive, or a high degree of its accuracy will be required in terms of smoothness since the setter plate can directly have a negative influence on the warpage of the ceramic substrate.

Meanwhile, another attempt can be made to employ the above-mentioned "composite substrate with its core substrate built up, in which the ceramic substrate is disposed in the opening of the core substrate of the build-up substrate, and also the resin material is provided on both sides of the core substrate". However, it is difficult to accurately dispose the ceramic substrate in the opening of the core, and also it is very difficult to perform an alignment of the build-up. This results in a low productivity.

SUMMARY OF THE INVENTION

Under the above circumstances, the present invention has been created. That is, a main object of the present invention is to provide a large-sized ceramic substrate capable of contributing to an improved productivity thereof, and particularly to provide the large-sized substrate with its reduced warpage and cracking.

To achieve the above mentioned object, the present invention provides a hybrid substrate comprising:

a core layer composed of a glass woven cloth as a reinforcing material, and a glass-ceramic sintered body which at least comprises a glass component and a metal oxide component (i.e., an inorganic metal oxide component), wherein, the glass woven cloth and the glass-ceramic sintered body formed by an impregnation with respect to the glass woven cloth are in a form of sintering integration with each other in the core layer.

One of characterizing features of the hybrid substrate according to the present invention is that the core layer portion is configured such that the glass woven cloth serving as the reinforcing material and the glass-ceramic sintered body formed by the impregnation of the glass woven cloth are integrated with each other by the sintering.

As used herein regarding the substrate of the present invention, the term "hybrid" means that the substrate is made of a plurality of materials. In particular, the "hybrid" is used in view of an embodiment wherein a substrate portion corresponding to the core layer of the substrate is made of a plurality of materials (specifically, such substrate portion is made of the glass component and the metal oxide component of the glass-ceramic sintered body, and also a glass fiber).

In a preferred embodiment, the glass component of the glass-ceramic sintered body in the core layer has a softening point which is lower than a softening point of the glass woven cloth. It is preferred that the glass component of the glass-ceramic sintered body is at least one glass component selected from the group consisting of a borosilicate glass, an aluminosilicate glass and an aluminoborosilicate glass. It is preferred that the metal oxide component of the glass-ceramic sintered body (i.e., the inorganic metal oxide component of the glass-ceramic sintered body) is at least one metal oxide component selected from the group consisting of an alumina, a mullite and a zirconia.

In another preferred embodiment, a diameter of a glass fiber of the glass woven cloth is in the range of 15 μm to 105 μm. Namely, the glass woven cloth of the core layer, which serves as the reinforcing material of the hybrid substrate, has a glass fiber yarn whose diameter is 15 μm or more and 105 μm or less.

In still another preferred embodiment, the hybrid substrate is in a form of a single substrate whose principal surface has a size of 255-600 mm×255-600 mm. In other words, the hybrid substrate according to the present invention has a large main surface of its own, the hybrid substrate being not provided by a combination of a plurality of sub-substrates.

The hybrid substrate of the present invention further comprises at least one through-hole which passes through the core layer, and also it comprises a wiring layer provided on each of opposing both sides of the core layer. Namely, the hybrid substrate is provided with at least one through-hole passing through the "glass-ceramic sintered body provided in a form of sintering integration with the glass woven cloth serving as the reinforcing material" and the wiring layers (i.e., wiring layers made of metal) provided on opposing both sides of the "glass-ceramic sintered body provided in a form of sintering integration with the glass woven cloth serving as the reinforcing material".

Furthermore, according to a different embodiment from the above-mentioned aspects, the hybrid substrate of the present invention may comprise a thermoset insulating resin layer provided on each of opposing both sides of the core layer, a wiring layer provided on the thermoset insulating resin layer, and at least one through-hole passing through the thermoset insulating resin layer and the core layer. Namely, the hybrid substrate according to this embodiment comprises the thermoset insulating resin layers provided on the opposing both sides of the "glass-ceramic sintered body provided in a form of sintering integration with the glass woven cloth serving as the reinforcing material", the wiring layers provided on the thermoset insulating resin layers, and at least one through-hole passing through the "glass-ceramic sintered body provided in a form of sintering integration with the glass woven cloth serving as the reinforcing material" and the thermoset insulating resin layers.

Preferably, the hybrid substrate of the present invention comprises a single layer of a build-up layer on at least one side thereof. It is preferred in this case that the build-up layer is composed at least of a build-up resin layer (which corresponds to an interlaminar resin layer), a via hole provided in the build-up resin layer, and a wiring layer (i.e., an electrode layer) provided on the build-up resin layer. The number of build-up layers is not limited to "single" but may be "plural". For example, in a case where the hybrid substrate comprises at least one through-hole passing through the "glass-ceramic sintered body provided in a form of sintering integration with the glass woven cloth" and the wiring layers provided on opposing both sides of the "glass-ceramic sintered body provided in a form of sintering integration with the glass woven cloth", the build-up layer (i.e., the first build-up layer) is provided by forming the build-up resin layer on the glass-ceramic sintered body so as to cover the wiring layer, followed by forming a further wiring layer on the resulting build-up resin layer. Subsequent to the provision of the first build-up layer, the second build-up layer may be optionally provided on such first build-up layer. It should be noted that a via hole is provided to electrically interconnect the wiring layers of the different layers. Furthermore, in a case where the hybrid substrate comprises the thermoset insulating resin layer provided on each of the opposing both sides of the "glass-ceramic sintered body provided in a form of sintering integration with the glass woven cloth", the wiring layer provided on the thermoset insulating resin layer, and the at least one through-hole passing through the "glass-ceramic sintered body provided in a form of sintering integration with the glass woven cloth" and the thermoset insulating resin layer, the build-up layer (i.e., the first build-up layer) is provided by forming the build-up resin layer on the glass-ceramic sintered body so as to cover the wiring layer, followed by forming the further wiring layer on the build-up resin layer. In a similar manner, the via hole is provided to electrically interconnect the wiring layers of different layers, and the second build-up layer may be optionally provided on such first build-up layer.

The present invention also provides a semiconductor integrated circuit package in which the above-mentioned hybrid substrate is used. The semiconductor integrated circuit package according to the present invention comprises the "glass-ceramic sintered body provided in a form of sintering integration with the glass woven cloth serving as the reinforcing material" and at least one build-up layer on at least one side of the glass-ceramic sintered body, wherein a semiconductor bare chip is flip-chip mounted on the build-up layer via a bump.

One of characterizing features of the semiconductor integrated circuit package according to the present invention is that the core layer portion of the substrate is configured such that the glass woven cloth serving as the reinforcing material and the glass-ceramic sintered body formed by impregnation of the glass woven cloth are integrated with each other by the sintering.

Furthermore, the present invention provides a method for manufacturing the above-mentioned hybrid substrate. The method according to the present invention comprises the steps of:

(i) impregnating a glass woven cloth with a slurry comprising a precursor component of a glass-ceramic sintered body (e.g., slurry comprising a glass powder, a metal oxide powder, an organic binder and a solvent), and thereby forming a glass-ceramic green sheet in which the glass woven cloth is contained as a base material (after the impregnation process, a drying treatment may be carried out as required); and (ii) subjecting the "glass-ceramic green sheet with the glass woven cloth contained therein as the base material" to a sintering process, and thereby forming a core layer composed of the glass woven cloth and the glass-ceramic sintered body from the glass-ceramic green sheet, and wherein, in the step (ii), a dummy green sheet which does not finally serve as a constituent component of the hybrid substrate is used wherein the dummy green sheet is disposed on each of opposing both sides of the glass-ceramic green sheet, and thereafter the glass-ceramic green sheet with the dummy green sheet provided on the both side thereof is subjected to the sintering process.

One of characterizing features of the manufacturing method of the hybrid substrate is that a sheet obtained by impregnating the glass woven cloth with the "slurry comprising the precursor component of the glass-ceramic sintered body" is used as a core layer precursor. Specifically, the "glass-ceramic green sheet with the glass woven cloth contained therein as a base material" obtained by the above-mentioned impregnation is used as the precursor material of the core layer, and such glass-ceramic green sheet is subjected to the sintering process to form the core layer of the "glass-ceramic sintered body with the glass woven cloth therein" from the glass-ceramic green sheet. Another feature of the manufacturing method of the present invention is to make use of the dummy green sheet which does not serve as a component of the hybrid substrate as the final product. Specifically, the dummy green sheet is provided on each of the opposing both sides of the "glass-ceramic green sheet with the glass woven cloth contained therein as a base material", followed by the sintering of the glass-ceramic green sheet.

It is preferred that the slurry used in the step (i) comprises a glass powder. It is more preferred that the glass powder of the slurry has a softening point which is lower than a softening point of the glass woven cloth. Such glass powder may be preferably a powder made of at least one glass component selected from the group consisting of a borosilicate glass, an aluminosilicate glass and an aluminoboroshilicate glass. It is preferred that the slurry used in the step (i) comprises a metal oxide powder (i.e., inorganic metal oxide powder). It is more preferred that the metal oxide powder of the slurry is a powder made of at least one metal oxide selected from the group consisting of an alumina, a mullite and a zirconia.

In a preferred embodiment, a green sheet comprising the metal oxide which is not sintered at a temperature of the sintering process of the step (ii) is used as the dummy green sheet. By using of this dummy sheet, the "glass-ceramic green sheet with the glass woven cloth contained therein" can be obtained in more preferred form. The dummy green sheet is used in the manufacturing process, but it does not finally exist as the component of the final hybrid substrate. In this regard, the dummy green sheet may be removed, for example after the step (ii). The removal of the dummy green sheet is preferably performed by removing the metal oxide derived from the dummy green sheet.

In another preferred embodiment, at least one through-bore is formed in the glass-ceramic green sheet at a point in time between the step (i) and the step (ii), and thereafter the through-bore is filled with an electrically conductive paste to form a through-hole precursor from the through-bore. In this case, from the through-hole precursor a through-hole is formed due to the sintering process of the step (ii).

In a still another preferred embodiment, an electrically conductive paste is printed on each of opposing both sides of the core layer to form a wiring layer precursor on each of the opposing both sides of the core layer, and thereafter the wiring layer precursor is subjected to a heat treatment to form a wiring layer from the precursor. In other words, after the formation of the "glass-ceramic sintered body with the glass woven cloth contained therein" as the core layer, the electrically conductive paste is supplied by printing process on each of the both sides of the glass-ceramic sintered body to form the wiring layer precursor, followed by a heat treatment (i.e., firing or sintering treatment) thereof, and thereby the wiring layer is provided from the wiring layer precursor.

In yet another preferred embodiment, a thermoset resin layer precursor is provided on each of opposing both sides of the core layer, and also a metal foil is provided on the thermoset resin layer precursor, and thereafter the thermoset resin layer precursor and the metal foil are subjected to a heat treatment to form a thermoset resin layer from the thermoset resin layer precursor, and the metal foil is subjected to a patterning process to from a wiring layer from the metal foil. In other words, after obtaining the "glass-ceramic sintered body with the glass woven cloth contained therein", both surfaces of the glass-ceramic sintered body may be provided with the thermoset resin layer, and the wiring layer may be made of the metal foil on the thermoset resin layer. In this embodiment, at least one through-bore passing through the core layer, the thermoset resin layer and the metal foil is formed at a point in time after the heat treatment of the thermoset resin layer precursor. From the through-bore, a through-hole is formed. Specifically, the through-hole can be formed after the formation of the "glass-ceramic sintered body with the glass woven cloth contained therein" (in other words, the through-hole can be formed after the heating treatment such as the firing (i.e., sintering) and the heat treatment according to the manufacturing method of the present invention).

In still yet another preferred embodiment, the step of forming a build-up layer on at least one side of the core layer is carried out at least one time. It is preferred in this forming step of the build-up layer that a build-up resin layer and a wiring layer disposed on the build-up resin layer are respectively formed. It is also preferred that a hole is formed in the build-up resin layer, and then a via-hole is formed from the hole.

Effect of the Invention

[Effect Provided by Hybrid Substrate and Semiconductor Integrated Circuit Package of Present Invention]

In the hybrid substrate according to the present invention, the core layer portion of the substrate has a sintered integration structure composed of the glass woven cloth and the glass-ceramic sintered body, the glass woven cloth being functioning as the reinforcing material and the glass-ceramic sintered body being formed by the impregnation of the glass woven cloth. Thus, the hybrid substrate of the present invention as a whole can be suitably treated as a large-sized single substrate. In this regard, the hybrid substrate of the present invention can have a large principal surface whose size is 255-600 mm×255-600 mm, for example.

Even if the hybrid substrate is formed into a large-sized thin substrate according to the present invention, the glass woven cloth serving as the reinforcing material can fulfill a role of keeping the whole substrate strong, and thereby an occurring of a cracking, a breaking and the like of the substrate can be suppressed.

The glass woven cloth as the reinforcing material also fulfills a role of effectively absorbing a stress which may be possibly exerted on the glass-ceramic sintered body. Thus, even when the hybrid substrate of the present invention is formed thinner and larger and also when the hybrid substrate is subjected to a heat treatment at a later time, a warpage of the substrate as a whole can be suppressed.

As such, the hybrid substrate of the present invention, even if being made thinner and larger, can have a reduced possibility of the cracking, breaking and warpage. Accordingly, a build-up substrate can be suitably manufactured from the hybrid substrate of the present invention by making use of a manufacturing infrastructure of a printed circuit board.

Particularly, in a case where the hybrid substrate of the present invention is used to manufacture a semiconductor integrated circuit package in which a semiconductor integrated circuit chip is mounted on the hybrid substrate, there can be realized the semiconductor integrated circuit package which is excellent in a connection reliability of the semiconductor bare chip due to an extremely small warpage of the substrate itself and also an extremely small extent of a warping occurred during the manufacturing process of the package.

Furthermore, due to the glass woven cloth contained in the hybrid substrate of the present invention, the hybrid substrate can have a low dielectric constant and thus is excellent in high frequency characteristics.

[Effect involved in Manufacturing Method of Present Invention]

Although the warpage of the substrate can be well suppressed due to the existence of the glass woven cloth contained in the hybrid substrate as described above, such warping phenomenon of the substrate can be more effectively suppressed additionally due to the manufacturing process of the hybrid substrate. Specifically, in the manufacturing method of the present invention, the core layer is obtained by such a process that the "glass-ceramic green sheet with the glass woven cloth as the base material contained therein" is sandwiched between the dummy green sheets, followed by being subjected to the sintering process. In this regard, the dummy sheets can serve to effectively reduce a warping of the produced substrate, such warping being possibly occurred during the sintering process.

Further, according to the manufacturing method of the present invention, the green sheet is manufactured based on the impregnation process of the glass woven cloth with the glass-ceramic material. This makes it possible to produce a large-sized sheet at more extremely high-speed and at lower cost, compared with the conventional producing method of the green sheet using a doctor blade. As such, the large-size of the substrate, which cannot be realized in a case of the ceramic based substrate, can be achieved according to the manufacturing process of the present invention. Accordingly, the hybrid substrate according to the present invention can be treated as if it is a printed circuit board, which can largely contribute to an improvement of the productivity.

Furthermore, according to the manufacturing method of the present invention, the through-hole can be formed at a point in time after the heating process such as a sintering treatment and a heat treatment. This means that the through-hole can be formed after the disposing of the thermoset insulating resin on the core layer provided by the sintering, for example. Accordingly, a suitable positional accuracy of the through-hole can be achieved in the substrate even when the substrate is made of the ceramic based material, which leads to a precise manufacturing of the hybrid substrate. In other words, the present invention makes it possible to avoid an undesirable phenomenon such as "misalignment of through-hole" which may be possibly induced by the heating process.

BRIEF DESCRIPTION OF THE DRAWINGS

FIGS. 1(a) and 1(b) are cross sectional views schematically illustrating the structure of a hybrid substrate according to a first embodiment of the present invention, in which FIG. 1(a) illustrates an embodiment wherein a glass-ceramic sintered body exists not only in the interior of a woven cloth but also on the surfaces of the woven cloth, and FIG. 1(b) illustrates an embodiment wherein the glass-ceramic sintered body exists only in the interior of the woven cloth.

FIGS. 2(a) and 2(b) are cross sectional views schematically illustrating the structure of the hybrid substrate including a single build-up layer on one of the surfaces of the hybrid substrate according to the first embodiment of the present invention, in which FIG. 2(a) illustrates an embodiment wherein the glass-ceramic sintered body exists not only in the interior of the woven cloth but also on the surfaces of the woven cloth, and FIG. 2(b) illustrates an embodiment wherein the glass-ceramic sintered body exists only in the interior of the woven cloth.

FIGS. 3(a) and 3(b) are cross sectional views schematically illustrating the structure of the hybrid substrate including two build-up layers on one of the surfaces of the hybrid substrate according to the first embodiment of the present invention, in which FIG. 3(a) illustrates an embodiment wherein the glass-ceramic sintered body exists not only in the interior of the woven cloth but also on the surfaces of the woven cloth, and FIG. 3(b) illustrates an embodiment wherein the glass-ceramic sintered body exists only in the interior of the woven cloth.

FIGS. 4(a) and 4(b) are cross sectional views schematically illustrating the structure of the hybrid substrate including three build-up layers on one of the surfaces of the hybrid substrate according to the first embodiment of the present invention, in which FIG. 4(a) illustrates an embodiment wherein the glass-ceramic sintered body exists not only in the interior of the woven cloth but also on the surfaces of the woven cloth, and FIG. 4(b) illustrates an embodiment wherein the glass-ceramic sintered body exists only in the interior of the woven cloth.

FIGS. 6(a) and 6(b) are cross sectional views schematically illustrates the configuration of a hybrid substrate according to a second embodiment of the present invention, in which FIG. 6(a) illustrates an embodiment wherein the glass-ceramic sintered body exists not only in the interior of the woven cloth but also on the surfaces of the woven cloth, and FIG. 6(b) illustrates an embodiment wherein the glass-ceramic sintered body exists only in the interior of the woven cloth.

FIGS. 11(a) and 11(b) illustrate a difference between the manufacturing process of the present invention and a manufacturing process of the prior art, in which FIG. 11(a) illustrates an impregnation method carried out by using the glass woven cloth according to the present invention, whereas FIG. 11(b) is a doctor blade method carried according to the prior art.

DETAILED DESCRIPTION OF THE INVENTION

Figure 1A:
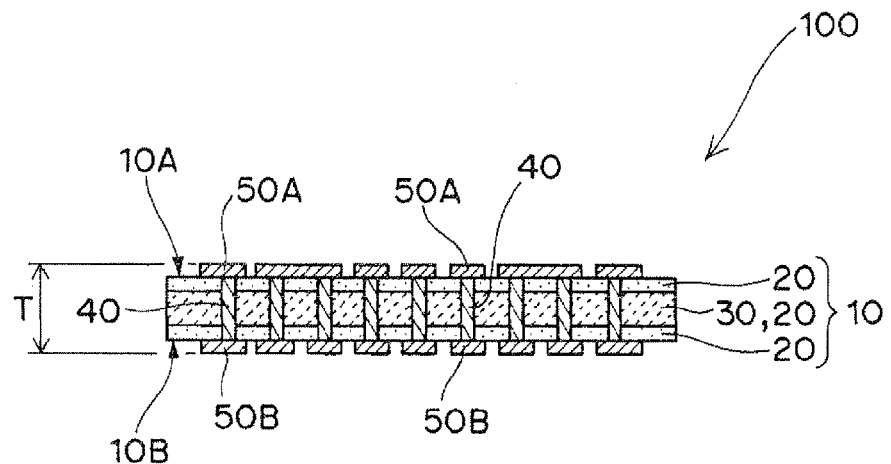

Hereinafter, some embodiments of the present invention are described with reference to Figures. In the following Figures, the same reference numeral indicates the element which has substantially the same function for simplified explanation. The dimensional relationship (length, width, thickness and so forth) in each Figure does not reflect a practical relationship thereof. Furthermore, the terms "upward" and "downward" referred to or suggested in the present description correspond to the upward and downward directions in Figures for convenience.

Hybrid Substrate of Present Invention

First Embodiment

Figure 1B:
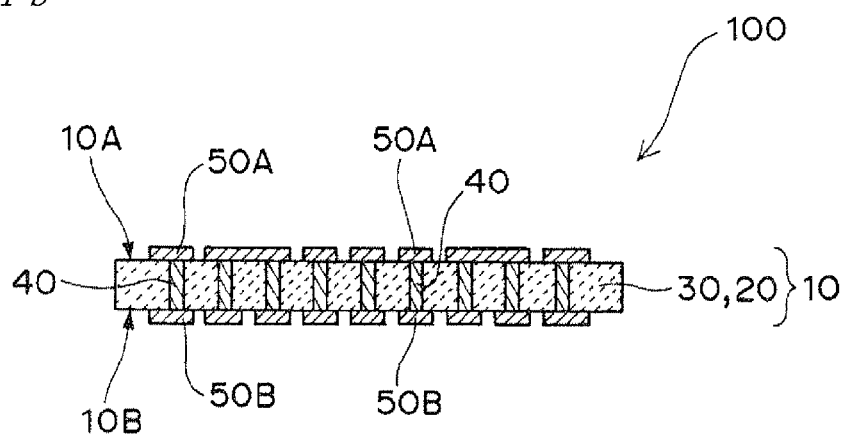

A hybrid substrate 100 of the present invention comprises, as illustrated in FIGS. 1(a) and 1(b), a glass-ceramic sintered body 20 and a glass woven cloth 30 existing therein. The glass-ceramic sintered body 20 and the glass woven cloth 30 provide a core layer 10 of the substrate 100. Specifically, the core layer of the hybrid substrate 100 comprises the glass woven cloth 30 serving as a reinforcing material, and the "glass-ceramic sintered body 20 which at least contains a glass component and a metal oxide component" obtained by an impregnation of the glass woven cloth. Particularly according to the present invention, the glass woven cloth 30 and the glass-ceramic sintered body 20 formed by the impregnation with respect to the glass woven cloth 30 are in a form of sintering integration with each other in the core layer 10 of the hybrid substrate.

As illustrated in FIG. 1, the hybrid substrate 100 according to the first embodiment comprises a through-hole 40 passing through the core layer 10 and wiring layers 50A, 50B on both opposed surfaces 10A, 10B of the core layer 10. The wiring layer 50A on the upper surface 10A of the core layer 10 and the wiring layer 50B of the lower surface 10B of the core layer 10 are preferably electrically connected to each other via the through-hole 40. In other words, the through-hole 40 preferably electrically interconnects the wiring layer 50A and the wiring layer 50B formed on both surfaces of the glass-ceramic sintered body 20 containing the glass woven cloth 30. The through-hole 40 may be at least made of a sintered body of the metal powder. The through-hole 40 may also be made of a copper plating material.

In the hybrid substrate according to the present invention, the core layer, i.e., a core portion of the substrate comprises the glass woven cloth functioning as the reinforcing material and the glass-ceramic sintered body formed by the impregnation of the glass woven cloth. In particular, the glass woven cloth and the glass-ceramic sintered body formed by the impregnation with respect to the glass woven cloth are in a form of sintering integration with each other in the core layer, and thereby the substrate of the present invention can be treated entirely as a large-sized substrate. As used herein, the term "sintering integration" means an embodiment wherein the "glass woven cloth" and the "glass-ceramic sintered body" are provided as single part in which they are mutually integrated by a sintering. Particularly, the "sintering integration" means an embodiment wherein the glass woven cloth is impregnated with a precursor slurry (i.e., a slurry containing a "precursor component of the glass-ceramic sintered body") to form the green sheet containing woven cloth therein, and thereafter a sintering treatment of the green sheet is performed. The glass woven cloth is a fabric component woven by using glass fiber yarn. Thus, such fabric component is impregnated with the "precursor slurry of the glass-ceramic sintered body" to provide the core layer. As such, the core layer has such a configuration that the "glass-ceramic sintered body" exists in an interior of the glass woven cloth and/or near the surface of the cloth (for example, FIG. 1(a) illustrates that the glass-ceramic sintered body exists not only in the interior of the woven cloth but also exits on the surface of the woven cloth, whereas FIG. 1(b) illustrates that the glass-ceramic sintered body exists only in the interior of the woven cloth). In other words, the core layer of the hybrid substrate according to the present invention has the "glass-ceramic sintered body" in such a manner that the glass yarn-woven cloth is contained in the whole interior of the core layer.

The "glass woven cloth" of the core layer will now be described in detail. With respect to a glass woven cloth for electronic materials, a plurality of glass fibers are formed into bundles and the bundles thereof are woven into a cloth. This woven cloth is generally used for a copper-clad laminate of a printed circuit board on which a semiconductor or an electronic component is mounted. Such glass woven cloth is also referred to as a glass cloth since it is woven. The glass woven cloth used in the present invention is preferably a glass woven cloth having a low dielectric constant which is suitable for a high-speed and high-frequency circuit. In this regard, the glass woven cloth may be an E-glass, for example. Since such E-glass has a thermal expansion coefficient which is close to that of the glass-ceramic sintered body, the E-glass is preferred also in this point.

A yarn diameter of the glass fiber to be used for the glass woven cloth will now be described. If the yarn of the glass fiber is too thick, the glass cloth becomes too strong and thus the glass-ceramic sintered body tends to be warped. On the other hand, if the yarn of the glass fiber is too thin, an improved elastic module cannot be obtained and thus the glass woven cloth becomes not suitable for "enlargement of the substrate". Therefore, a preferable diameter of the glass fiber (i.e., a cross sectional diameter of the yarn) in the glass woven cloth is "about 15 μm or more" and "about 105 μm or less", and more preferably "about 20 μm or more" and "about 48 μm or less".

The hybrid substrate of the present invention can be preferably provided as a large-sized substrate owing to the existence of the glass woven cloth. In the light of this point, a size of the principal surface of the glass woven cloth can be relatively large. In other words, a lateral width L×a vertical width W of the glass woven cloth 30 may have relatively large dimensions such as L: about 255-600 mm×W: about 255-600 mm (for example, L: about 300-500 mm×W: about 300-500 mm). On the other hand, with respect to a thickness of the glass woven cloth, if it is too thin, a necessary strength cannot be kept. On the other hand, if it is too thick, "thin" effect of the hybrid substrate is reduced. Therefore, the thickness of the glass woven cloth itself is preferably in the range of about 100 μm to about 300 μm, and more preferably in the range of about 150 μm to about 250 μm.

The "glass-ceramic sintered body" of the core layer will now be described in detail. The "glass-ceramic sintered body" has a material serving as a glass-ceramic material. Namely, the glass-ceramic sintered body at least includes a glass component and a metal oxide (i.e., an inorganic metal oxide). Particularly, since the core layer is formed by impregnating the glass woven cloth with the "precursor slurry of the glass-ceramic sintered body", followed by a sintering thereof, the "glass-ceramic sintered body" of the core layer can exist in the interior space and/or near the surface of the glass woven cloth. The size of the core layer after the integration of the glass woven cloth and the glass-ceramic sintered body may be a relatively large in accordance with the size of the glass woven cloth serving as the base material. In other words, the lateral width L×vertical width W×thickness T of the core layer 10 may have relatively large dimensions of L: 255-600 mm×W: 255-600 mm×T: 100-300 μm (e.g., L: about 300-500 mm×W: about 300-500 mm×about 150-250 μm).

The metal oxide component of the "glass-ceramic sintered body" is preferably at least one metal oxide component selected from the group consisting of an alumina, a mullite and a zirconia. The content of the metal oxide component is preferably in the rage of about 45% to about 75% by weight, based on the weight of the glass-ceramic sintered body. The glass component of the "glass-ceramic sintered body" is preferably a glass having a low melting point. The content of the glass component is preferably in the range of about 25% to about 55% by weight, based on the weight of the glass-ceramic sintered body. By way of example only, the "glass-ceramic sintered body" may be a glass-ceramic composition which contains about 55% by weight of an alumina component and about 45% by weight of the glass component.

A sintering temperature for an alumina substrate which is commonly used as the ceramic substrate is high (e.g., about 1600° C.) and thus a high-melting-point metal such as W and Mo is used. However, since such metal can exhibit a high resistance. Thus, it is preferable that a sintering temperature is about 900° C. or lower at which low-resistance Ag or Cu can be used as a wiring material. In this point, the present invention makes it possible to lower the sintering temperature by utilizing a melting of the glass. In this case, the low-melting-point glass powder is mixed with a metal oxide (e.g., alumina powders). A borosilicate glass, an aluminosilicate glass, an aluminoboroshilicate glass or the like is used as the "low-melting-point glass". In other words, the glass component of the "glass-ceramic sintered body" is preferably at least one low-melting-point glass component selected from the group consisting of the borosilicate glass, aluminosilicate glass and aluminoboroshilicate glass.

The low-temperature sintering as described above is preferable since it does not cause a melting of fiber yarns of the glass woven cloth during the forming of the "glass-ceramic sintered body". In other words, it is preferred that the glass component of the glass-ceramic sintered body in the core layer preferably has a softening point which is lower than that of the glass woven cloth. For example, the glass component of the glass-ceramic sintered body has the softening point of preferably 400° C. to 700° C., and more preferably 450° C. to 600° C. It is preferred in this regard that the glass component of the glass-ceramic sintered body is at least one glass component selected from the group consisting of the borosilicate glass, the aluminosilicate glass and the aluminoboroshilicate glass.

Even if the hybrid substrate of the present invention is provided as a large-sized thin substrate, the glass woven cloth serving as the reinforcing material functions to reinforce the substrate as a whole and also to effectively absorb a stress possibly generated in the sintered body. Consequently, the cracking and breaking of the substrate can be well suppressed, and also a warpage of the substrate can be suppressed. For example, referring to the hybrid substrate as illustrated in FIG. 1(a), the size of the principal surface of the substrate can be larger one of 255-600 mm×255-600 mm, and also the thickness (i.e., "T" illustrated in the drawing) of the substrate can be thinner one of about 80 μm to about 400 μm, and preferably about 100 μm to about 300 μm.

Figure 2A:
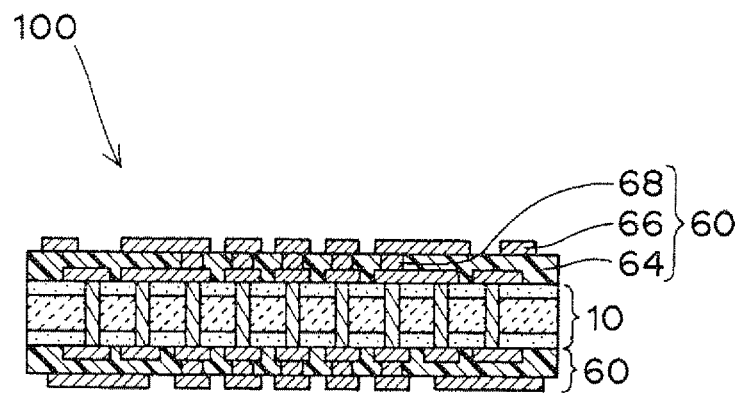
Figure 2B:
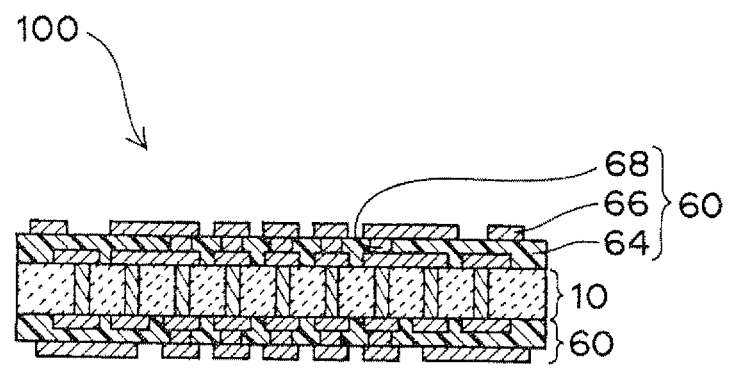
Figure 3A:
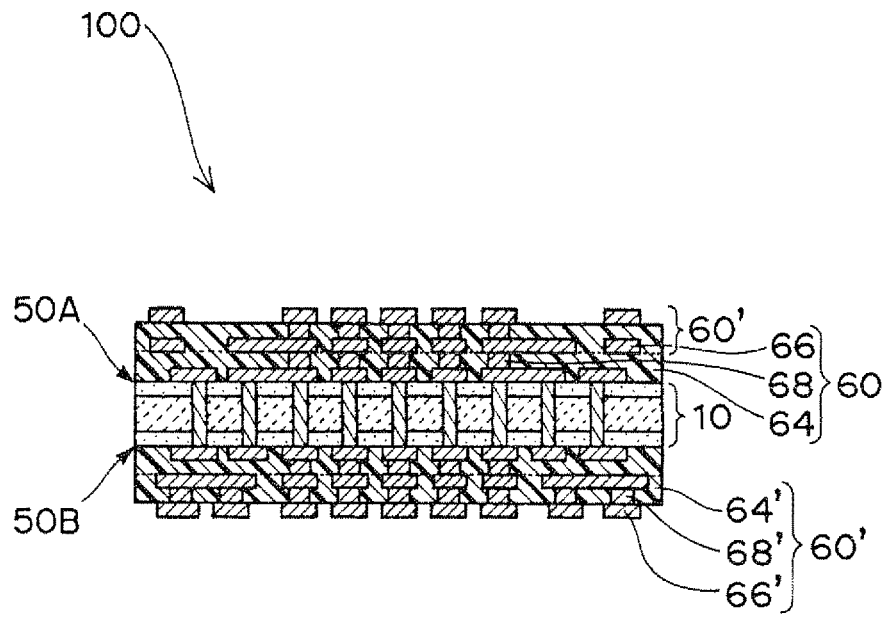
Figure 3B:
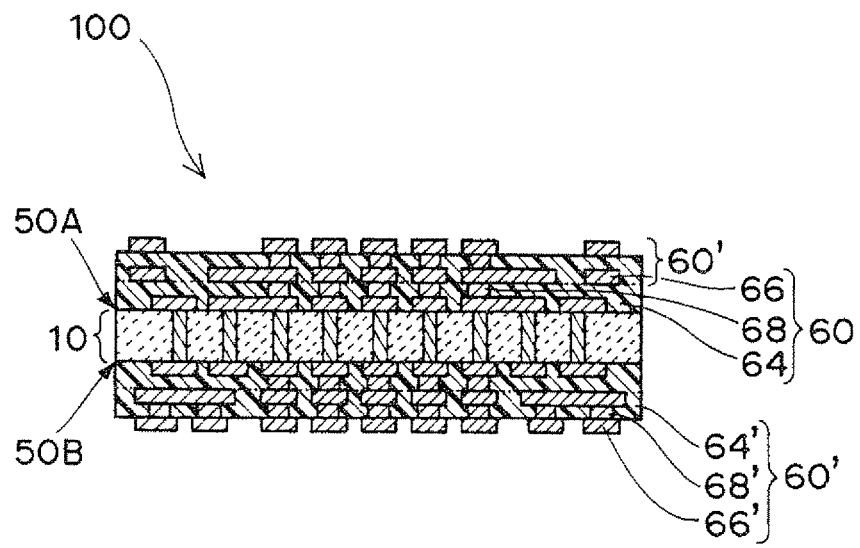
Figure 4A:
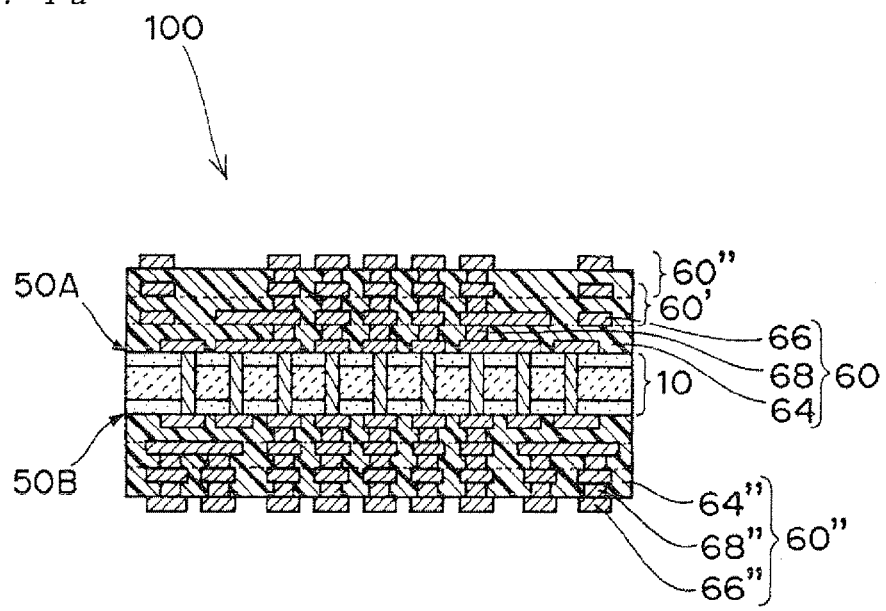
Figure 4B:
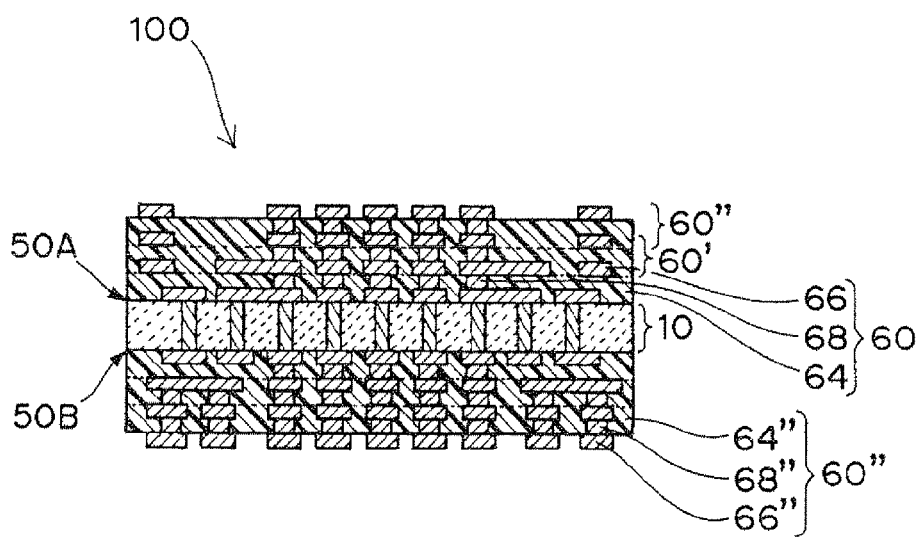

As illustrated in FIGS. 2 through 4, the hybrid substrate 100 according to the present invention may comprise a build-up layer 60 on at least one side of the substrate. As illustrated (for example, as illustrated in FIG. 2), the build-up layer 60 at least comprises a build-up resin layer 64 (i.e., a thermoset insulating resin layer 64) which corresponds to an interlaminar resin layer, a wiring layer 66 provided on the build-up resin layer 64, and a via hole 68 provided in the build-up resin layer 64. For example, as illustrated in FIGS. 3 and 4, the build-up resin layer 64 is provided on the core layer 10 such that the layer 64 covers wiring layers 50A, 50B on the surfaces of the core layer, and the wiring layer 66 and the via hole 68 are provided for the build-up resin layer 64. The first build-up layer 60 is composed of the build-up resin layer 64, the wiring layer 66 and the via hole 68. If required, the second build-up layer 60', the third build-up layer 60", . . . may be provided on the first build-up layer in a similar manner. In other words, the hybrid substrate 100 of the present invention can be provided as a build-up substrate comprising the resin layer and the wiring layer which substantially serve as the build-up layer and are laminated for desired layer numbers. In the build-up layer, the via hole can serve to interconnect the different wiring layers.

The resin layer 64 in the build-up layer may be made of a thermoset resin (e.g., an epoxy resin), and a thickness thereof may be in the range of about 40 μm and about 80 μm. On the other hand, the wiring layer 66 of the build-up layer may be made of metal (e.g., copper), and a thickness thereof may be in the range of about 10 μm to about 50 μm. The via holes 68 may be made of an electrically conducting material (e.g., copper), and a diameter thereof may be in the range of about 60 μm to about 140 μm.

Figure 5:
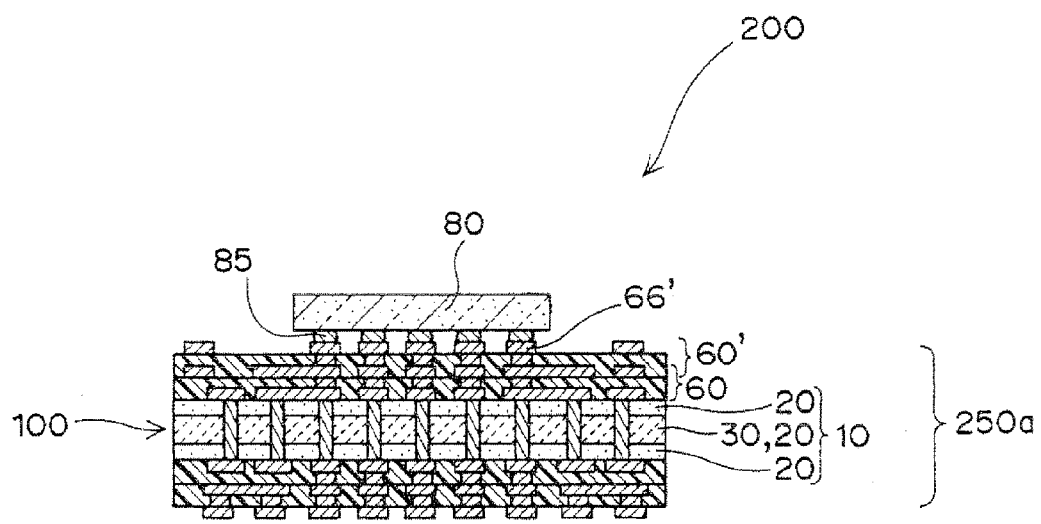
FIG. 5 is a cross sectional view schematically illustrating a semiconductor integrated circuit package comprising the hybrid substrate (according to the first embodiment).

When a semiconductor bare chip is mounted on the hybrid substrate including the build-up layer, a semiconductor integrated circuit package can be obtained therefrom. FIG. 5 illustrates the semiconductor integrated circuit package 200 in which the semiconductor bare chip 80 is mounted on the hybrid substrate 100 with the two build-up layers (60, 60') contained therein. As illustrated in FIG. 5, it is preferred in the semiconductor integrated circuit package 200 that the semiconductor bare chip 80 is flip-chip mounted on the build-up layers (60, 60') via a bump 85. For example, the semiconductor bare chip 80 may be mounted via a solder bump 85 according to C4 (Controlled Collapse Chip Connection) mounting.

The semiconductor integrated circuit package 200 according to the present invention is comprised of the substrate in which the glass-ceramic sintered body 20 with the glass woven cloth 30 contained therein as the reinforcing material is used as the core layer for the built up. Thus, the semiconductor integrated circuit package 200 can have very small degree of the warpage which may be attributed to the thermal history during various processes to be carried out for the mounting of the semiconductor bare chip. Therefore, an electrical connection between the semiconductor bare chip 80, the bump 85, and the wiring layer 66' (i.e., layer provided on a surface of the substrate) is very stable in the semiconductor integrated circuit package 200 of the present invention.

Second Embodiment

Figure 6A:
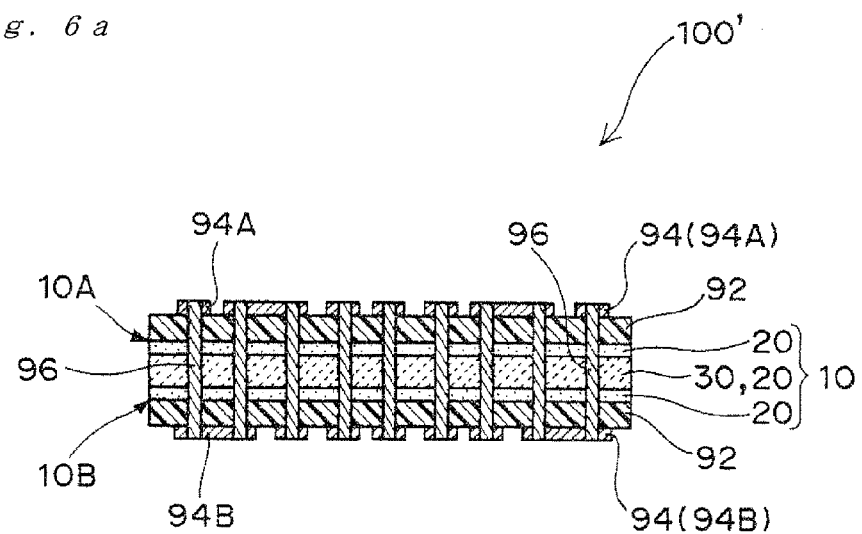
Figure 6B:
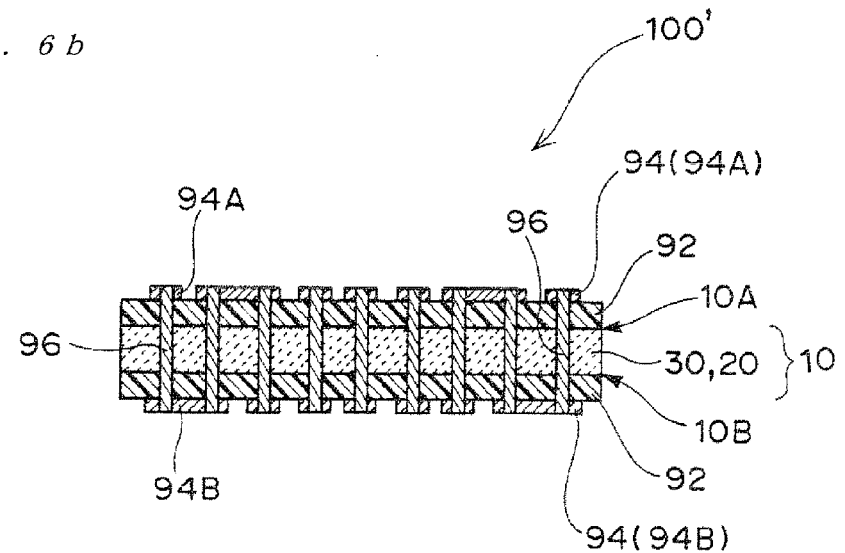

The present invention makes it possible to embody the various configurations of the hybrid substrate which comprises the core layer including the glass woven cloth and the glass-ceramic sintered body integrated together by sintering. For example, the configuration of a hybrid substrate 100' as illustrated in FIGS. 6(a) and 6(b) can be possible according to the present invention. As illustrated in FIGS. 6(a) and 6(b), the hybrid substrate 100' comprises thermoset insulating resin layers 92 on both opposed surfaces 10A, 10B of the "core layer 10 comprising the glass woven cloth 30 and the glass-ceramic sintered body 20 existing in and/or on the glass woven cloth 30". The thermoset insulating resin layers 92 are provided with the wiring layers 94 thereon. Further, through-hole 96 is provided so as to pass through the core layer 10 and the thermoset insulating resin layers 92 in the hybrid substrate 100'.

Even in the case of the hybrid substrate 100' as illustrated in FIGS. 6(a) and 6(b), the core layer 10 has such a configuration that the glass woven cloth 30 and the glass-ceramic sintered body 20 formed by impregnation with respect to the glass woven cloth 30 are in a form of sintering integration with each other.

Compared with the configuration of the hybrid substrate 100 according to the first embodiment, the hybrid substrate 100' according to the second embodiment is configured such that the wiring layer 94 is provided not on the surface of the core layer but on the thermoset resin layer 92, and the through-hole 96 is provided to pass through the thermoset resin layers 92 and the core layer 10. The through-hole 96 serves to electrically interconnect the wiring layers 94 (i.e., the wiring layer 94A and the wiring layer 94B) provided on the thermoset resin layers 92. As will be described below, such through-hole 96 can be provided after the formation of the core layer, i.e., after the glass woven cloth and the glass-ceramic sintered body are integrated together by sintering. Thus, the positioning of the through-holes 96 is particularly accurate. The through-hole 96 may be at least made of a sintered body material obtained from metal powder. The through-hole 96 may also be made of copper plating material. For example, the through-holes may be formed by performing a copper plating process with respect to wall surface of the through-hole.

Figure 7:
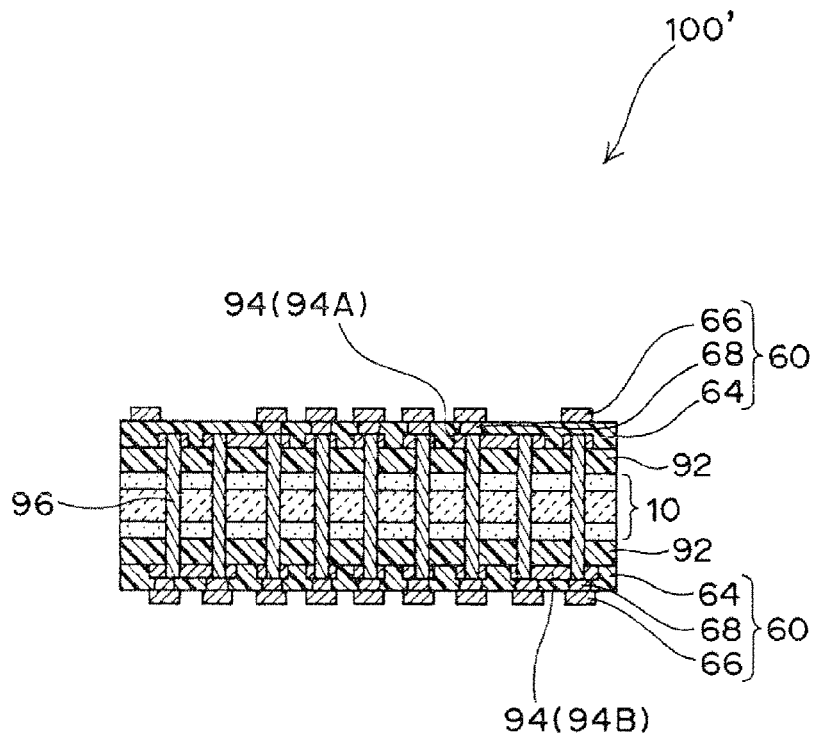
FIG. 7 is a cross sectional view schematically illustrating the structure of the hybrid substrate including a single build-up layer on one of the surfaces thereof according to the second embodiment of the present invention.

As illustrated in FIG. 7, the hybrid substrate 100' can also be provided with a build-up layer 60 on at least one surface of the hybrid substrate 100'. In other words, as illustrated in FIG. 7, the build-up layer 60 may be provided by forming the build-up resin layers 64 so that they cover the wiring layers 94 (94A, 94B) on the thermoset resin layers 92, followed by forming the wiring layers 66 on the build-up resin layers 64 (each of the build-up resin layers 64 can be provided with via hole 68 formed therein). Namely, the hybrid substrate 100' of the present invention can be configured to be the build-up substrate including the desired numbers of the resin layers 64 and the desired numbers of the wiring layers 66 as the build-up layers 60.

Figure 8:
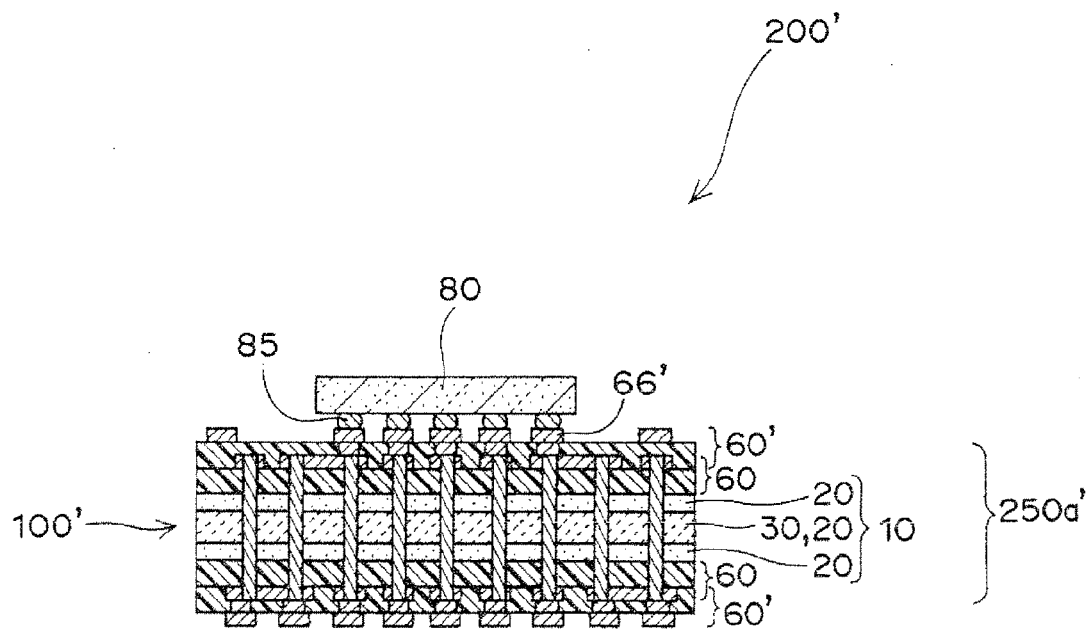
FIG. 8 is a cross sectional view schematically illustrating a semiconductor integrated circuit package comprising the hybrid substrate (according to the second embodiment).

Further, similar to the first embodiment, the semiconductor integrated circuit package can be provided by mounting the semiconductor bare chip on the hybrid substrate 100' equipped with the build-up layer. FIG. 8 illustrates a semiconductor integrated circuit package 200' having such a configuration that the semiconductor bare chip 80 is mounted on the hybrid substrate 100' equipped with the two build-up layers (60, 60'). As illustrated in FIG. 8, the semiconductor bare chip 80 is flip-chip mounted on the build-up layers (60, 60') via a bump 85 in such semiconductor integrated circuit package 200'.

[Method for Manufacturing Hybrid Substrate According to Present Invention]

Figure 9:
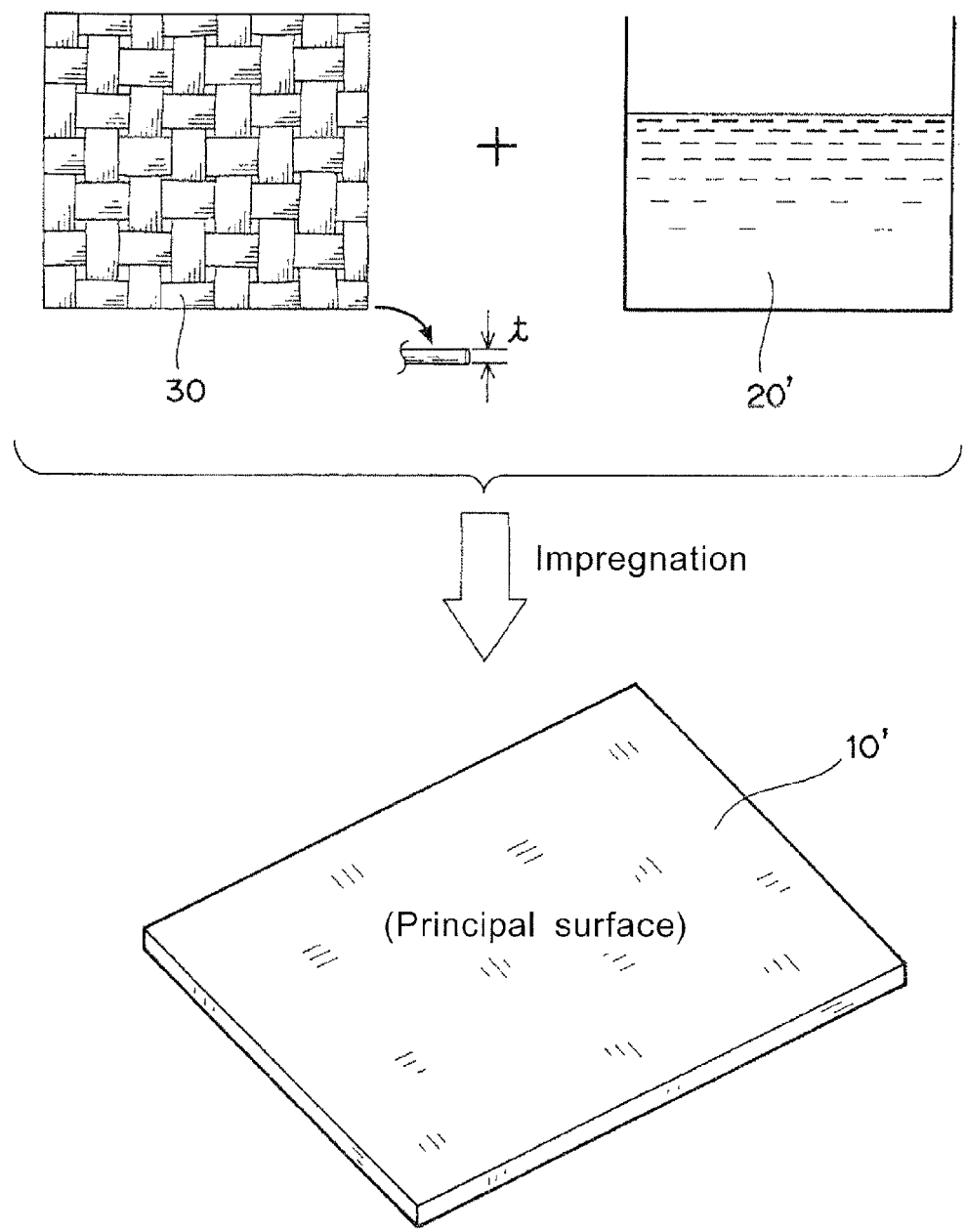
FIG. 9 is a schematic view illustrating an embodiment wherein the glass woven cloth is impregnated with a "slurry containing a precursor component of glass-ceramic sintered body" to produce a "glass-ceramic green sheet with the glass woven cloth contained therein as a base material".

The method for manufacturing the hybrid substrate of the present invention will be described below with reference to FIGS. 9 through 11.

To carry out the manufacturing method of the present invention, the step (i) is firstly performed. Specifically, as illustrated in FIGS. 9 and 10(a), a glass woven cloth 30 is impregnated with a slurry 20' which contains a precursor component of the glass-ceramic sintered body to form a glass-ceramic green sheet 10' in which the glass woven cloth is contained as a base material. In other words, the glass woven cloth 30 is impregnated with the slurry 20', and thereby providing an interior space and surface of the woven cloth 30 with the slurry 20'. According to the present invention, the impregnation process can also be regarded as a process for impregnating the glass fiber fabric cloth with a slurried material of the green sheet component of the ceramic.

Subsequent to the impregnation process of the step (i), a drying treatment may be performed, as required. In other words, the glass woven cloth 30 impregnated with the slurry 20' may be subjected to a heat treatment or a decompression treatment to reduce the organic solvent contained in the slurry 20' from the green sheet 10'.

The "slurry 20' which contains the precursor component of the glass-ceramic sintered body" is a slurry which at least contains a glass component and a metal oxide component (i.e., an inorganic metal oxide component). More specifically, the slurry 20' preferably contains a glass powder, a metal oxide powder (i.e., an inorganic metal oxide powder), an organic binder resin, a plasticizer and an organic solvent. The glass powder preferably has a softening point lower than that of the fiber of the glass woven cloth (for example, the glass powder has the softening point of preferably 400 to 700° C., and more preferably 450 to 600° C.) For instance, the glass powder is preferably a powder containing at least one glass component selected from the group consisting of a borosilicate glass, an aluminosilicate glass and an aluminoborosilicate glass. It is preferred that the metal oxide powder used for the slurry material is a powder containing at least one metal oxide component selected from the group consisting of an alumina, a mullite and a zirconia. It is preferred that the organic binder resin used for the slurry material is at least one organic binder resin selected from the group consisting of a polyvinyil butyral resin and an acrylic resin. It is preferred that the organic solvent used for the slurry material is at least one organic solvent selected from the group consisting of xylene and MEK.

The glass woven cloth 30 used in the step (i) is preferably made of E-glass as described above. It is preferred to use a glass woven cloth in which a diameter of the glass fiber is preferably "about 15 μm or more" and "about 105 μm or less", and more preferably "about 20 μm or more" and "about 48 μm or less". The thickness of the glass woven cloth 30 used in the step (i) (i.e., "t" as illustrated in FIG. 9) is preferably in the range of about 100 μm to about 300 μm, and more preferably in the range of about 150 μm to about 250 μm.

Figure 11A:
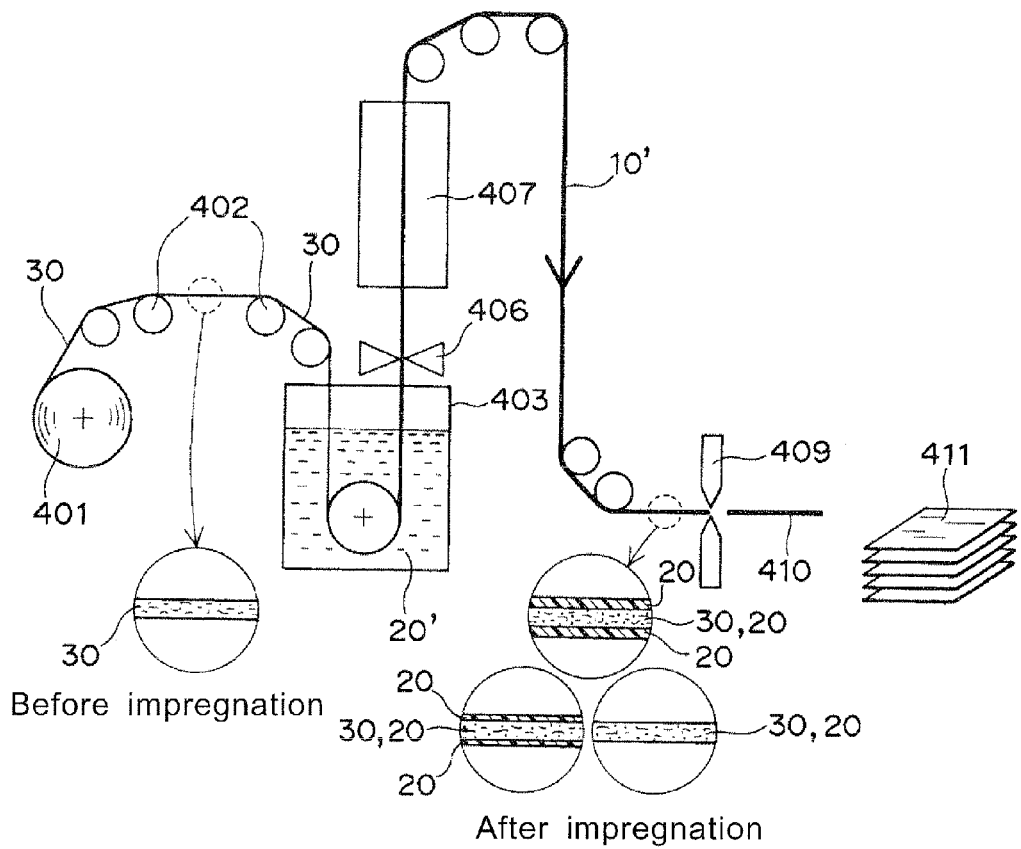
Figure 11B:
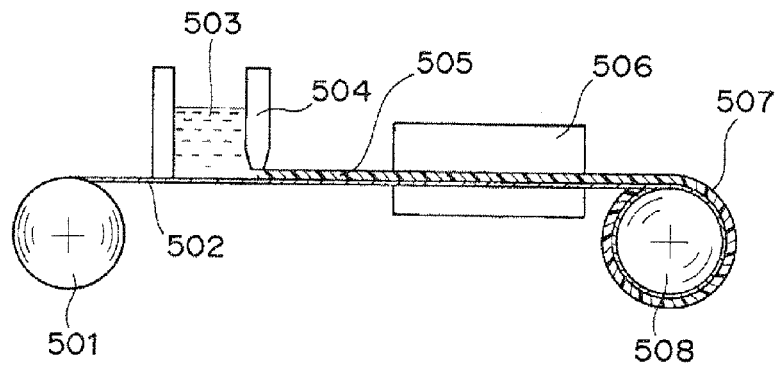

According to the present invention, the impregnation of the glass woven cloth can be performed by the process as illustrated in FIG. 11(*a*). Such process will now be described. The glass woven cloth 30 is wound out from a roll 401 to be conveyed by a roll 402. The glass woven cloth 30, which is being conveyed, is impregnated with the "slurry 20' containing the precursor component of the glass-ceramic sintered body" in a slurry container 403 and then is taken out from the slurry container 403 in a longitudinal direction of the cloth. Then, the glass woven cloth 30 containing the slurry 20' therein passes through a slit 406 having a constant gap. As a result, the excessive slurry is scraped, thereby enabling a control of the thickness of the resulting sheet, i.e., a control of the amount of impregnation of the slurry. Subsequently, the glass woven cloth 30 impregnated with a certain amount of the slurry 20' passes through a drying zone 407 where the organic solvent is removed. Consequently, there can be formed the green sheet 10' reinforced with the glass woven cloth, i.e., the "glass-ceramic green sheet 10' with the glass woven cloth contained therein as the base material". The glass-ceramic green sheet 10' thus formed is then cut 410 into a desired size by a cutting device 409, and thereby a plurality of green sheets 411 are provided.

The above impregnation method using the glass woven cloth requires no carrier film of the conventional doctor blade and can be dried from the both side of the sheet. Therefore, such impregnation method is more advantageous in terms of productivity and cost.

The prior art process of the conventional doctor blade will be illustrated in FIG. 11(*b*). In the conventional doctor blade process, a raw material slurry 503 is supplied to a carrier film 502 made of PET or PPS. The carrier film 502 with the slurry supplied thereon is then conveyed through doctor blades 504 having a gap of a certain size between the rolls 501 and 508. Accordingly, the slurry 503 on the carrier film becomes have a thickness corresponding to the gap of the doctor blade 504, and thereby a slurry film 505 is formed on the carrier film. Then, the slurry film 505 is conveyed to pass through a drying zone 506 allowing the organic solvent contained therein to evaporate, and thereby a green sheet 507 is formed. Finally, the green sheet 507 thus formed is rolled up by the roll 508. As such, the doctor blade process uses the carrier film 502 made of PET, and thus it is hard to dry the green sheet from the side of the carrier film 502. Therefore, the drying takes time and thus productivity becomes inferior when the thicker green sheet is formed.

Subsequent to the step (i), the step (ii) is performed. In other words, the "glass-ceramic green sheet with the glass woven cloth contained therein as the base material" is subjected to a sintering, and thereby the core layer 10 made of the glass woven cloth and the glass-ceramic sintered body is formed. In the step (ii), as illustrated in FIG. 10(*b*), it is preferred to use a dummy green sheet 600. Specifically, the dummy green sheets 600 are disposed on opposing both sides of the glass-ceramic green sheet 10', and thereafter the sintering of the glass-ceramic green sheet 10' with the dummy green sheets disposed thereon is performed. Such dummy green sheet 600 is used in the course of the manufacturing process, but the dummy green sheet 600 does not finally serve as a constituent component of the hybrid substrate. It is preferred that the dummy green sheet 600 contains a metal oxide powder (e.g., an inorganic metal oxide powder such as an alumina powder), an organic binder resin (e.g., a polyvinyil butyral resin or an acrylic resin), an organic solvent (e.g., xylene or MEK) and a plasticizer, for example.

By utilizing the dummy green sheet 600, the sintering can be performed while suppressing a shrinkage of the glass-ceramic green sheet 10', especially suppressing the shrinkage of the sheet 10' in its planar direction. In this regard, the glass-ceramic substrate including the glass woven cloth as the reinforcing material, if being subjected to the sintering at a temperature of 900° C. with no dummy sheet, may be shrunk in its planar direction or in its thickness direction according to the sintering, resulting in an awkward sintered body. This is due to the fact that the shrinkage of the glass woven cloth as the reinforcing material in its planar direction and the shrinkage of the glass-ceramic due to the sintering occur at the same time. The present inventors have intensively studied and thus found out that the planar-direction shrinkage can be suppressed by using of the dummy green sheet while only causing the thickness-direction shrinkage. In such sintering process for well-suppressing the planar-direction shrinkage, the both surfaces of the impregnated glass-ceramic green sheet are provided with the dummy green sheet to be laminated thereon, followed by sintering thereof. Use of the green sheet 600 containing the metal oxide which is not sintered at a temperature of the sintering of the step (ii) is more preferred since the suppressing effect of the planar-direction shrinkage becomes remarkably high. For example, a green sheet containing alumina (100%) as a nonorganic component, and an organic binder having the same composition as that of the glass-ceramic green sheet, a plasticizer, and an organic solvent may be used as the dummy green sheet 600.

The dummy green sheets 600 are preferably laminated under a temperature conditions of a softening point or higher of the organic binder which is contained in the dummy green sheet (e.g., under the temperature condition of 60° C. to 120° C.) under a pressure condition capable of bonding the organic binder (e.g., under the pressure condition of 1 MPa to 3 MPa).

The green sheet-laminated body is preferably formed in such a manner that the glass-ceramic green sheet 10' is sandwiched between the dummy green sheets 600, and then is subjected to a debinding process (i.e., after processing at a temperature of 300° C. to 500° C. for about 1 to 3 hours in air, for example, the debinding process at a temperature of about 450° C. for about 2 hours in air), followed by the sintering process (e.g., under sintering condition of a temperature of about 800 to 950° C. for 0.15 to 3 hours, preferably 850° C. to 900° C. for 0.5 to 2 hours, e.g., about 900° C. for one hour). Upon the sintering process under the above conditions, the alumina sheets provided as a surface layer (i.e., the dummy green sheet 600) can prevent the glass-ceramic green sheet 10' from shrinking in the planar direction while allowing the glass-ceramic green sheet 10' to shrink only in the thickness direction.

Figure 10:
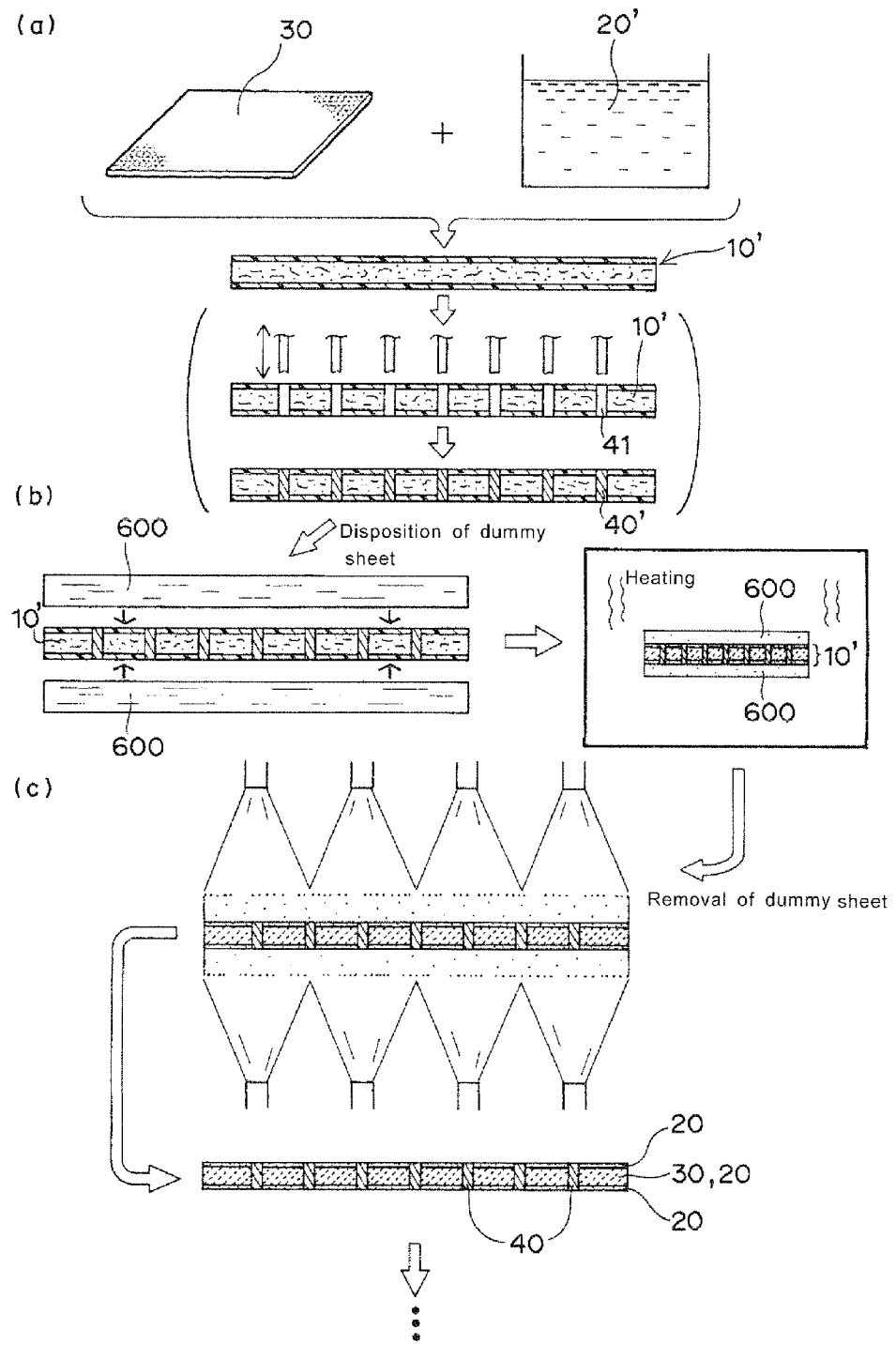
FIGS. 10(a) to 10(c) are schematic views illustrating a process of a manufacturing method of the present invention.

After the sintering process, a layered material derived from the dummy green sheet (e.g., a layer made of the metal oxide contained in the dummy green sheet) is removed by a blasting process as illustrated in FIG. 10(*c*). In other words, the residual material remaining on the both surfaces of the core layer (e.g., the alumina powder layer derived from the dummy green sheet) is removed. Accordingly, there can be finally obtained the core layer 10 in which the glass woven cloth 30 and the glass-ceramic sintered body 20 are in an integrated form due to the sintering. In such core layer 10, the glass woven cloth 30 existing as the reinforcing material is substantially kept as it is, due to the control of the planar direction shrinkage. Thus, even with a large size, the glass-ceramic sintered body 20 can be provided with no warpage.

According to the sintering process as described above, the core layer 10 including the glass-ceramic sintered body 20 and the glass woven cloth 30 disposed therein can be obtained. The through-hole can be formed in the core layer. In this regard, a through-hole precursor can be formed at a point in time between the impregnation process of step (i) and the sintering process of step (ii), as illustrated in FIG. 10. For example, the through-hole precursor can be formed between the steps (i) and (ii) by forming a through-bore 41 in the glass-ceramic green sheet 10', followed by filling the through-bore 41 with an electrically conductive paste. Accordingly, upon the sintering process of step (ii), the through-hole 40 is formed from the through-hole precursor 40'. As will be described below, such through-hole 40 can be formed even after the sintering process of step (ii), which remarkably improves a positional accuracy of the through-hole.

In the sintering process, the dummy green sheet which does not serve as the constituent component of the hybrid substrate is used. In this regard, the dummy green sheet is disposed on opposing both sides of the glass-ceramic green sheet, followed by the sintering thereof. As a result, the effect to suppress the planar-direction shrinkage can be provided. In addition to this, when the dummy green sheet is used such that the glass-ceramic green sheet is sandwiched by the dummy sheets, such an effect can be produced that the warpage upon the sintering can be well suppressed due to a uniform suppressing effect of the dummy green sheets provided on the both surfaces. It should be noted in this regard that, when the dummy green sheet is not used, the warpage upon the sintering depends on the warpage of the sintering setter.

The manufacturing process of the hybrid substrate 100 according to the first embodiment will now be exemplified with reference to FIGS. 12(a) through 12(e).

Figure 12:
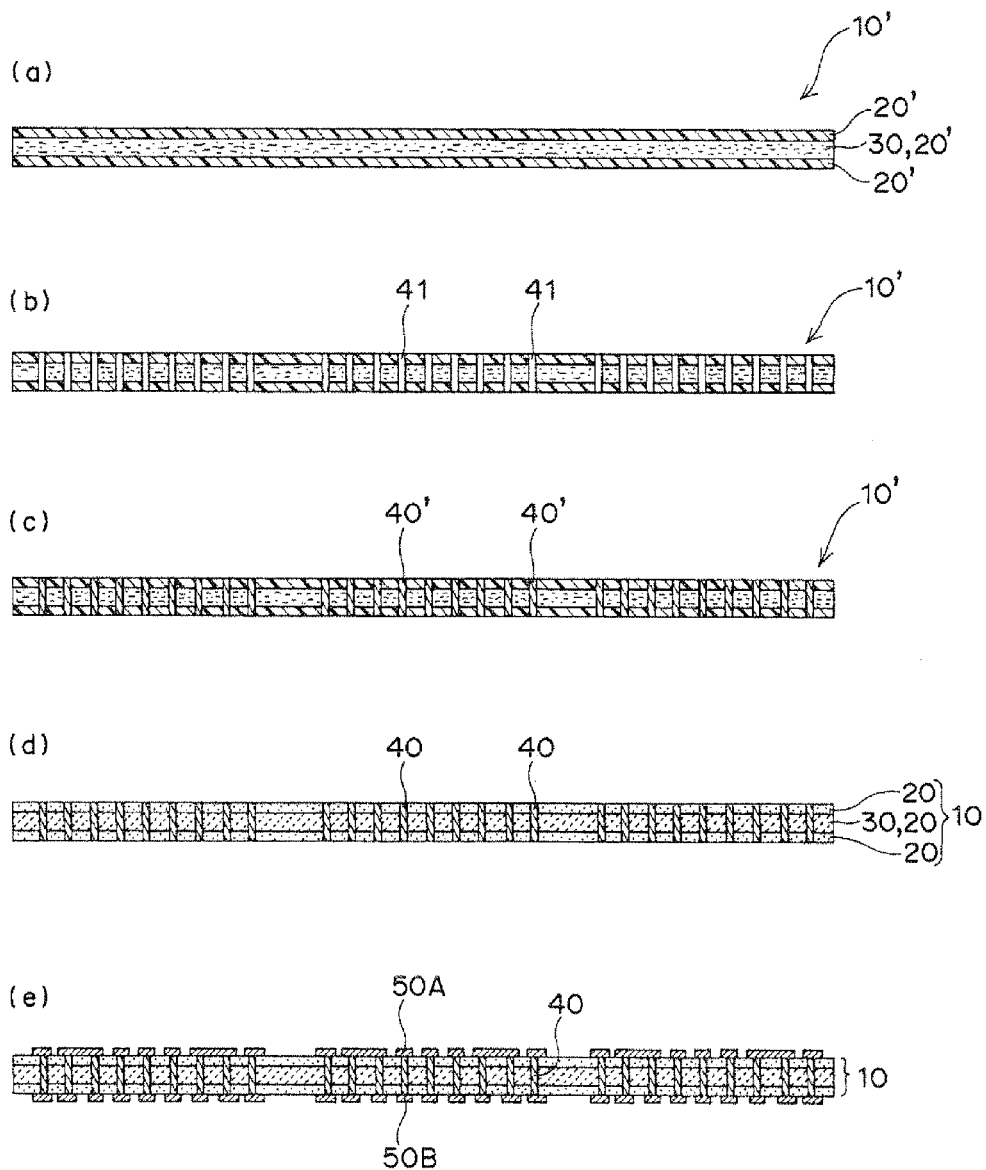
FIGS. 12 (a) to 12(e) are cross sectional views each illustrating the step of the manufacturing process of the hybrid substrate according to the first embodiment of the present invention.

The green sheet 10' as illustrated in FIG. 12(a) is a sheet obtained by impregnating the glass woven cloth 30 with a "slurry 20' containing the precursor component of the glass-ceramic sintered body", followed by a drying thereof. For example, the green sheet 10', after being dried, may have a thickness of about 100 µmt to about 300 µmt (e.g., about 200 µmt) and the principal surface may have a size of about 255-600 mm×about 255-600 mm (e.g., about 300 mm×about 300 mm).

FIG. 12(b) illustrates an embodiment wherein a plurality of through-bores 41 are formed at their predetermined positions in the green sheet 10' (e.g., a diameter of each through-bore 41 is approximately in the range of 100 µm to 200 µm. For example, such diameter may be about 150 µm). For instance, a numerical control (NC) punch press or a carbon dioxide gas laser may be employed for forming the through-bores 41.

Subsequently, as illustrated in FIG. 12(c), the through-bores 41 provided in the green sheet 10' are respectively filled with the electrically conductive paste. The electrically conductive paste may be one obtained by kneading a silver powder (Ag: particle diameter of about 1 µm to 4 µm, for example, the particle diameter of 2 µm) as an electrically conductive material with an ethyl cellulose organic binder and a terpineol solvent by means of three rolls. The electrically conductive paste thus obtained is filled into the through-bores 41 by means of a squeegee, thereby forming the through-hole precursor 40'. Then, the green sheet 10' including through-hole precursor 40' thus formed is subjected to the sintering process in which the shrinkage is prevented from occurring in the planar direction to provide the sintered body 10 (see FIG. 12(d)). Upon the sintering process, the positions of the through-holes 40 obtained by sintering thereof together with the green sheet almost do not change, compared to those of the through-bores 41. This makes it possible to achieve a good positional accuracy of the through-holes 40. The reason for this is that the shrinkage is prevented from occurring in the planar direction. Similarly, the glass-ceramic sintered body 20 can be obtained in a flat form which is free from distortion and warpage due to the sintering process in which the shrinkage is prevented from occurring in the planar direction.

Subsequent to the sintering process, a wiring-pattern paste is provided on the both surfaces of the glass-ceramic sintered body 20 (i.e., the core layer 10) by performing a screen printing using conductive paste. The print-paste is then subjected to the sintering process to form the wiring layers 50A, 50B therefrom (see FIG. 12(e)).

Throughout the above-mentioned process, there can be finally obtained the hybrid substrate 100 according to the first embodiment as illustrated in FIG. 1(a). The hybrid substrate 100 obtained by the above-mentioned processes has a thickness of about 50 µm to about 150 µm (e.g., a thickness of about 100 µm) and the principal surface (after the sintering) may have dimensions of about 250-600×about 250-600 mm (e.g., 300×300 mm). The hybrid substrate 100 is remarkably thin and large in view of the ceramic substrate. The hybrid substrate 100 of the present invention, in spite of being thin and large, has no cracking/breaking, and it also has some flexibility (i.e., the occurring of the cracking is prevented under the condition of R=about 300) since the "glass woven cloth" is contained as the reinforcing material. As such, the hybrid substrate of the present invention is very convenient in handling thereof.

Now, with reference to FIGS. 13(a) through 13(d), a process for the build-up by using the hybrid substrate 100 according to the first embodiment of the present invention will be exemplified.

Figure 13:
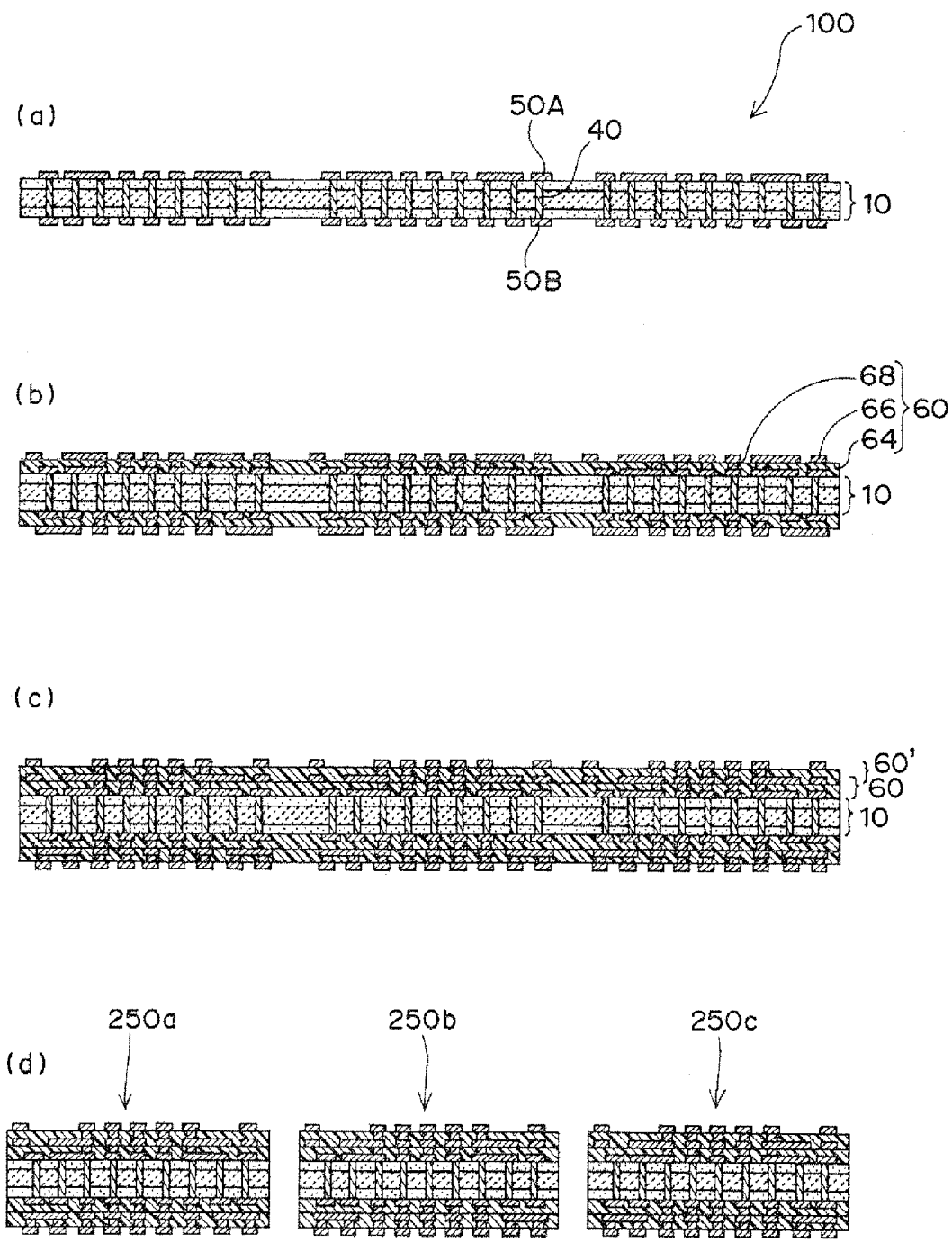
FIGS. 13(a) to 13(d) are cross sectional views each illustrating the step of a manufacturing process in which the hybrid substrate according to the first embodiment of the present invention is used to carry out a build-up.

FIG. 13(a) illustrates a hybrid substrate 100 including the core layer 10, the through-holes 40, and the wiring layers 50A, 50B therein. FIG. 13(b) illustrates an embodiment wherein the hybrid substrate 100 is used as a core and both surfaces thereof are provided with the layers which are laminated by a build-up method.

In the build-up method, the uncured build-up resin layer 64 and the metal foil (e.g., the copper foil) as the wiring layer 66 are laminated on the surface of the hybrid substrate 100. The uncured build-up resin layer 64 is then subjected to a curing process by heating thereof. A thermoset resin such as an epoxy resin can be used as the build-up resin layer 64. A resin with an inorganic filler (e.g., $SiO_2$) added thereto may also be used for controlling a thermal expansion coefficient. A copper foil is preferably used as the metal foil. More specifically, an electrolytic copper foil having a thickness of about 10 to 14 µm (e.g., about 12 µm) may be used as the metal foil.

Subsequently, bores having a diameter of about 60 µm to 140 µm (e.g., a diameter of about 100 µm) are formed at desired positions in the build-up resin layer 64 via the metal foil by using the carbon dioxide gas laser. Then, the bores are subjected to, for example, a desmear process, a catalyst-applying process, an electroless copper plating process, and an electrolytic copper plating process, and thereby completing a connection of the via hole 68.

Subsequent to the formation of the via holes 68, the copper plating layer (i.e., metal foil region) is subjected to an etching process by photolithography, thereby forming the wiring layer 66. Through the repetition of such build-up layer forming process for a desired number of times, there can be finally obtained the built-up hybrid substrate from which a large number of semiconductor packages can be provided (see FIG. 13(c)).

Finally, as illustrated in FIG. 13(d), the hybrid substrate is cut into pieces to provide a plurality of circuit substrates 250a, 250b, 250c for the semiconductor integrated circuit package.

The semiconductor bare chip is then flip-chip mounted on the circuit substrates via the solder bump, and thereby the semiconductor integrated circuit package is provided. For example, FIG. 5 illustrates a semiconductor integrated circuit package 200 obtained by mounting the semiconductor bare chip 80 on the circuit board 250a according to a C4 mounting method. The semiconductor integrated circuit package 200 includes a substrate core layer which contains the glass-ceramic sintered body reinforced by the glass woven cloth. Both surfaces of substrate core layer in the package 200 are built-up. Due to such substrate core layer, the degree of the substrate warpage, which may be attributed to various thermal histories, are very small, and also the substrate portion has the thermal expansion coefficient close to that of the semiconductor bare chip, which leads to an achievement of the high reliability of the flip-chip mounting. Further, the heat generated in the semiconductor bare chip can swiftly dissipate since the improved heat conductivity is provided than that of the normal build-up substrate. Furthermore, since the glass woven cloth is used as the reinforcing material, not only the substrate of the semiconductor integrated circuit package can be provided as larger-sized one than that of the normal ceramic substrate, but also the substrate of the semiconductor integrated circuit package can be made thinner than that of the normal ceramic substrate.

As to the "enlargement of the substrate" which corresponds to one of features of the present invention, the detailed explanation is as follows: The sintered body having about 100 mm square could only be obtained in the normal ceramic substrate. However, the substrate having a size of 330 mm×500 mm or 500 mm×500 mm, which is a typical size in the printed circuit board industry, can be obtained according to the present invention. Therefore, the present invention provides such a remarkably excellent advantage in the industrial field that an infrastructure of the printed circuit board industry (specifically, equipment of the build-up maker) can be utilized as it is.

The manufacturing process and a build-up process of the hybrid substrate 100' according to the second embodiment will now be exemplified with reference to FIGS. 14(a) through 14(i).

A green sheet 10' of FIG. 14(a) is obtained in the same manner as the manufacturing process of the first embodiment. Namely, the green sheet 10' is obtained by impregnating the glass woven cloth 30 with a "slurry 20' containing the precursor component of the glass-ceramic sintered body", followed by a drying thereof. Preferably, the green sheet 10' is cut to have, for example, a thickness of about 150 to 350 μm (e.g., about 250 μm) and a size of the principal surface of about 255-600 mm×255-600 mm (e.g., 500 mm×500 mm).

When the green sheet 10' is subjected to the sintering process while suppressing the planar-direction shrinkage as illustrated in FIG. 14(b), the "core layer 10 including the glass woven cloth 30 and the glass-ceramic sintered body 20 formed by impregnation of the glass woven cloth being integrated together due to the sintering" can be obtained.

Subsequently, the uncured thermoset insulating resin 92 and metal foil 94 are respectively laminated on the both surfaces of the core layer 10 as illustrated in FIG. 14(c). The uncured thermoset insulating resin is subjected to a curing process by heating thereof. For example, as the insulating resin layers 92 and the metal foils 94, a copper foils 94 having a thickness of about 10 to 14 μm (e.g., a thickness of about 12 μm) are applied with an epoxy resin having a thickness of about 40 to 80 μm (e.g., a thickness of about 60 μm). Specifically, with a flexible epoxy resin component as the epoxy resin, the stress applied between the glass-ceramic sintered body 20 and the metal foils 94 can be suitably released. It is also possible to use, as the thermoset insulating resin layers 92, a material obtained by impregnating a woven cloth of a glass fiber having a diameter of about 6 μm to 9 μm which is woven into mesh with a thermoset resin such as a polyimide resin. A sheet-shaped copper foil having a thickness of about 10 to 14 μm (e.g., about 12 μm) produced by an electroplating method can be used as the metal foil 94. Preferably, surfaces of sides of the bonding surfaces of the metal foils 94 are roughened and the other surfaces of sides of the core layer are subjected to an antioxdation treatment. For example, the lamination process and the curing process with respect to the thermoset insulating resin 92 and the metal foil 94 are performed by applying heat and pressure in an up-and-down direction of the core layer 10, the insulating resin layers (uncured) 92, and the metal foils 94 which are laminated together. Accordingly, the glass-ceramic sintered body 20 and the metal foils 94 of the core layer 10 are bonded together via the insulating resin layers 92 (FIG. 14(d)). For example, the pressure applied in the up-and-down direction may be set to about 0.3 MPa to about 0.7 MPa (e.g., about 0.5 MPa), a heat temperature to be applied may be set to about 150 to 250° C. (e.g., about 200° C.), and a period of time for applying thereof may be set to about 0.5 hours to about 1.5 hours (e.g., about 1 hour).

Then, as illustrated in FIG. 14(e), the through-bores 95 passing through the core layer 10, the insulating resin layers 92, and the metal foils 94 are formed by irradiating a carbon dioxide gas laser.

Subsequently, as illustrated in FIG. 14(f), a wall surface of each through-bore and surfaces of the metal foils 94 are subjected to an electroless copper plating, followed by further electrolytic copper plating (e.g., a thickness of the copper plating may be from about 15 μm to 20 μm). The surface-plated metal foils are subjected to a patterning process by etching to form the wiring layers 94 as illustrated in FIG. 14(g). The dry film resist is disposed on the surface of the copper plating layer, followed by the etching of the copper layer by UV exposure with a mask of a desired wiring pattern. The copper layer is then subjected to a development treatment, and thereafter a part of thereof is etched away by using a ferric chloride solvent. As a result, the wiring pattern can be provided after the removal of the resist Throughout the above-mentioned process, there can be finally obtained the hybrid substrate 100' as illustrated in FIG. 6(a), i.e., the hybrid substrate 100' according to the second embodiment.

The hybrid substrate 100' can also be provided as a large-sized one whose principal surface size is about 255-600 mm×255-600 mm (e.g., about 500 mm×500 mm), for example. Accordingly, when the substrate is subjected to a multi-layer process in the following build-up process, the substrate can be treated by using the same infrastructure, not as the ceramic substrate but as the normal build-up substrate core.

The thickness of the hybrid substrate 100' of the present invention (i.e., the total thickness regarding the sum of the core layer 10, the insulating resin layers 92 provided on both surfaces thereof, and the wiring layers 94 of the metal layer/ the copper plating) can be in the range of about 150 μm to about 450 μm (e.g., about 300 μm). Such thickness of the substrate according to the present invention is about a half of the thickness (i.e., 700 μm) of the normal build-up substrate. Even so, the cracking and breaking can be decreased in the substrate according to the present invention.

For performing the subsequent build-up process, the uncured build-up resin layer 64 and the copper foil as the wiring layer 66 are provided on the surface of the hybrid substrate 100', followed by being subjected to a heating treatment to causing a curing of the build-up resin layer. A thermoset resin such as an epoxy resin can be used as the build-up resin layer 64. Preferably, the metal foil is a copper foil such as an electrolytic copper foil having a thickness of, for example, about 10 μm to 14 μm (e.g., about 12 μm). Subsequently, bores having a diameter of about 60 to 140 μm (e.g., about 100 μm) are formed by means of the carbon dioxide gas laser at their desired positions in the build-up resin layers 64 via the copper foils. Thereafter the via holes 68 can be formed according to, for example, the desmear process, the catalyst-applying process, the electroless copper plating process, and electrolytic copper plating process.

After formation of the via holes 68d, the copper plating layer (i.e., the portion of the metal foil) is subjected to an etching by photolithography to form the wiring layer 66. Through the repetition of such build-up layer forming process for a desired number of times, there can be finally obtained the built-up hybrid substrate 100' from which a large number of semiconductor packages can be provided (see FIG. 14(*h*)).

Figure 14:
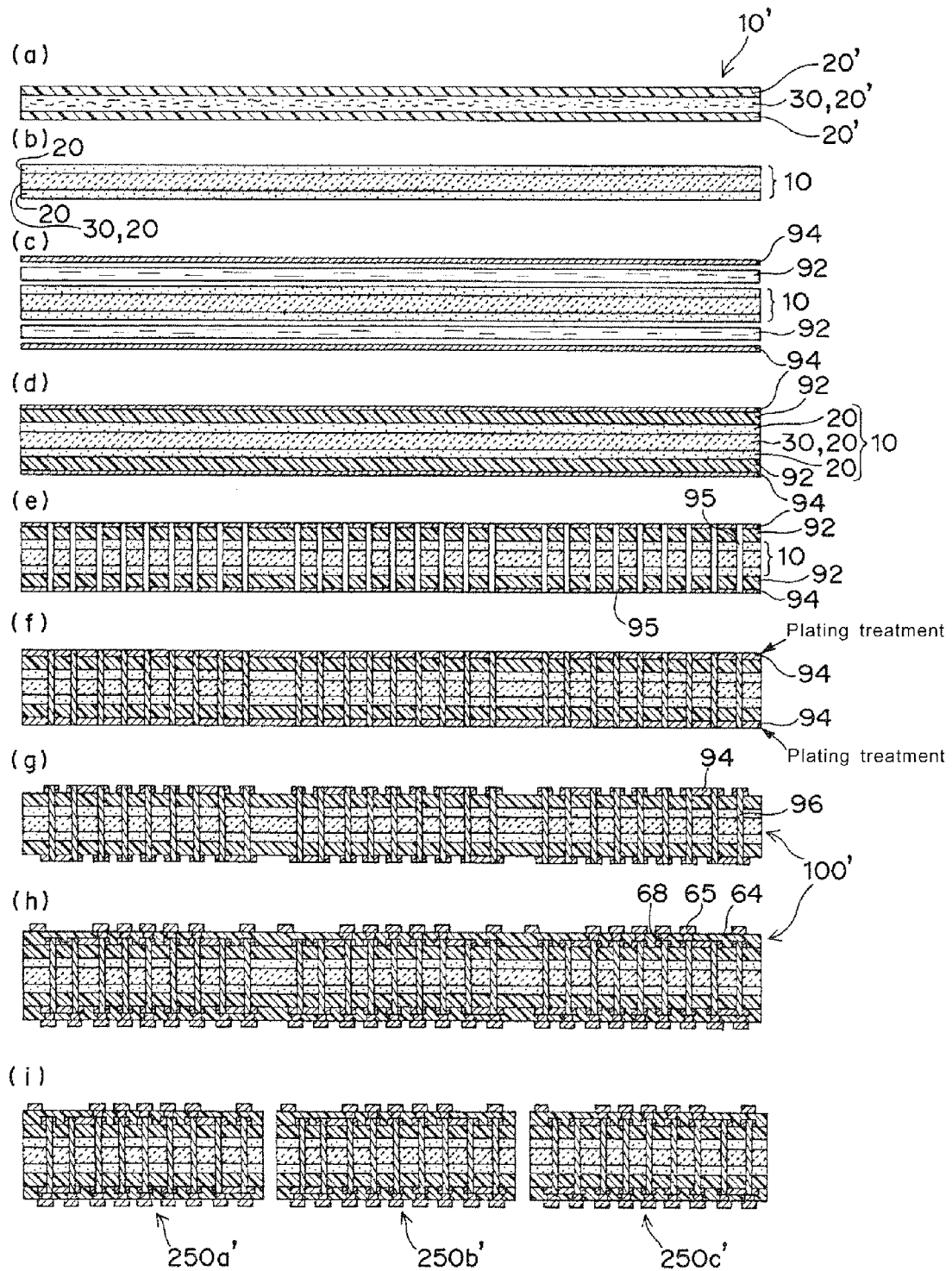
FIGS. 14(a) to 14(i) are cross sectional views each illustrating the step of a manufacturing process of the hybrid substrate according to the second embodiment of the present invention (i.e., the step of a manufacturing process including the build-up step).

Finally, as illustrated in FIG. 14(*i*), the hybrid substrate is cut into pieces to provide a plurality of circuit substrates 250a', 250b', 250c' used for the semiconductor integrated circuit package.

The semiconductor bare chip is then flip-chip mounted on the circuit substrate via the solder bump to provide the semiconductor integrated circuit package. For example, FIG. 8 illustrates a semiconductor integrated circuit package 200' obtained by mounting the semiconductor bare chip 80 on the circuit board 250a' according to the C4 mounting method. Such semiconductor integrated circuit package 200' has remarkably stable connection reliability with respect to various thermal histories. Specifically, the stress applied between the core layer, the build-up layer and the wiring layer can be well-released, and thus a disadvantage such as the occurring of the separation can be reduced. Further, the substrate warpage and a degree thereof are also suppressed, so that the connection reliability between the semiconductor bare chip 80 and the solder bump 85 is very stable.

Although a few embodiments of the present invention have been hereinbefore described, they are merely typical embodiments, and thus the present invention is not limited to those embodiments. It will be readily appreciated by those skilled in the art that various embodiments can be additionally or alternatively conceivable.

For example, although the present invention as described above includes the embodiments wherein the through-holes 96 of the hybrid substrate 100' according to the second embodiment (FIG. 6) are formed after the lamination of the insulating resin layer 92 and the metal foil 94. However, the present invention is not necessarily limited to such embodiment. The through-holes 96 may be formed immediately after the core layer 10 is formed (i.e., after the heating treatment for sintering to obtain the core layer and before lamination of the insulating resin layer 92 and the metal foil 94).

It should be noted that the present invention as described above includes the following aspects and the advantageous effects:

The First Aspect:
  A hybrid substrate comprising:
  a core layer composed of a glass woven cloth serving as a reinforcing material, and a glass-ceramic sintered body which at least comprises a glass component and a metal oxide component,
  wherein, the glass woven cloth and the glass-ceramic sintered body formed by an impregnation with respect to the glass woven cloth are in a form of sintering integration with each other in the core layer.

The Second Aspect:
  The hybrid substrate according to the first aspect, further comprising:
  at least one through-hole which passes through the core layer; and
  a wiring layer provided on each of opposing both sides of the core layer.

The Third Aspect:
  A hybrid substrate comprising:
  a core layer composed of a glass woven cloth serving as a reinforcing material, and a glass-ceramic sintered body which at least comprises a glass component and a metal oxide component;
  a thermoset insulating resin layer provided on each of opposing both sides of the core layer;
  a wiring layer provided on the thermoset insulating resin layer; and
  at least one through-hole which passes through the thermoset insulating resin layer and the core layer,
  wherein, the glass woven cloth and the glass-ceramic sintered body formed by an impregnation with respect to the glass woven cloth are in a form of sintering integration with each other in the core layer.

The Fourth Aspect:
  The hybrid substrate according to any one of the first to third aspects, comprising at least one build-up layer on at least one side of the hybrid substrate,
  wherein the build-up layer is at least composed of a build-up resin layer (which corresponds to an interlaminar resin layer), a via hole provided in the build-up resin layer, and a wiring layer (or electrode layer) provided on the build-up resin layer.

The Fifth Aspect:
  The hybrid substrate according to any one of the first to fourth aspects, wherein the glass component of the glass-ceramic sintered body has a softening point which is lower than that of the glass woven cloth.

The Sixth Aspect:
  The hybrid substrate according to any one of the first to fifth aspects, wherein a glass fiber diameter of the glass woven cloth is "15 μm and more" and "105 μm and lower".

The Seventh Aspect:
  The hybrid substrate according to any one of the first to sixth aspects, wherein the hybrid substrate is in a form of a single substrate whose principal surface has a size of 255-600 mm×255-600 mm.

The Eighth Aspect:
  The hybrid substrate according to any one of the first to seventh aspects, wherein the glass component of the glass-ceramic sintered body is at least one glass component selected from the group consisting of a borosilicate glass, an aluminosilicate glass and an aluminoborosilicate glass.

The Ninth Aspect:

The hybrid substrate according to any one of the first to eighth aspects, wherein the metal oxide component of the glass-ceramic sintered body is at least one metal oxide component selected from the group consisting of an alumina, a mullite and a zirconia.

The Tenth Aspect:

A semiconductor integrated circuit package comprising the hybrid substrate according to any one of the fifth to ninth aspects when appendant to the fourth aspect, wherein a semiconductor bare chip is in a flip-chip mounted form on the build-up layer via a bump.

The Eleventh Aspect:

A method for manufacturing a hybrid substrate, comprising the steps of:

(i) impregnating a glass woven cloth with a slurry comprising a precursor component of a glass-ceramic sintered body, and thereby forming a glass-ceramic green sheet in which the glass woven cloth is contained as a base material (after the impregnation process, a drying treatment may be carried out, as required); and (ii) subjecting the "glass-ceramic green sheet with the glass woven cloth contained therein as the base material" to a sintering process, and thereby forming a core layer composed at least of the glass woven cloth and the glass-ceramic sintered body, wherein, in the step (ii), a dummy green sheet which does not finally serve as a constituent component of the hybrid substrate is used wherein the dummy green sheet is disposed on each of opposing both sides of the glass-ceramic green sheet, and thereafter the "glass-ceramic green sheet with the dummy green sheet provided thereon as well as with the glass woven cloth contained therein as the base material" is subjected to the sintering process.

The Twelfth Aspect:

The method according to the eleventh aspect, wherein at least one through-bore is formed in the "glass-ceramic green sheet with the glass woven cloth therein as the base material" at a point in time between the step (i) and the step (ii), and thereafter the through-bore is filled with an electrically conductive paste to form a through-hole precursor therefrom, and wherein a through-hole is formed from the through-hole precursor due to the sintering process of the step (ii).

The Thirteenth Aspect:

The method according to the eleventh or twelfth aspect, wherein an electrically conductive paste is printed on each of opposing both sides of the core layer to form a wiring layer precursor on each of the opposing both sides of the core layer, and thereafter the wiring layer precursor is subjected to a heat treatment to form a wiring layer from the precursor.

The Fourteenth Aspect:

A method for manufacturing a hybrid substrate, comprising the steps of:

(i) impregnating a glass woven cloth with a slurry comprising a precursor component of a glass-ceramic sintered body, and thereby forming a glass-ceramic green sheet in which the glass woven cloth is contained as a base material;

(ii) subjecting the "glass-ceramic green sheet with the glass woven cloth contained therein as the base material" to a sintering process, and thereby forming a core layer composed at least of the glass woven cloth and the glass-ceramic sintered body; and (iii) providing a thermoset resin layer precursor on each of opposing both sides of the core layer, and also providing a metal foil on the thermoset resin layer precursor, in which step the thermoset resin layer precursor and the metal foil are subjected to a heat treatment to form a thermoset resin layer from the thermoset resin layer precursor, and the metal foil is subjected to a patterning process to from a wiring layer from the metal foil, wherein, in the step (ii), a dummy green sheet which does not finally serve as a component of the hybrid substrate is used wherein the dummy green sheet is disposed on each of opposing both sides of the glass-ceramic green sheet, and thereafter the "glass-ceramic green sheet with the dummy green sheet provided thereon as well as with the glass woven cloth contained therein as the base material" is subjected to the sintering process.

The Fifteenth Aspect:

The method according to the fourteenth aspect, wherein at least one through-bore passing through the core layer, the thermoset resin layer and the metal foil is formed at a point in time after the heat treatment of the thermoset resin layer precursor, and thereafter a through-hole is formed from the through-bore.

The Sixteenth Aspect:

The method according to any one of the eleventh to fifteenth aspects, further comprising at least one step of forming a build-up layer on at least one side of the core layer, wherein, in the forming step of the build-up layer, a build-up resin layer (which corresponds to an interlaminar resin layer) and a wiring layer disposed on the build-up resin layer are respectively formed, and thereafter a bore (hole) is formed in the build-up resin layer, and a via-hole is formed from the bore (hole).

The Seventeenth Aspect:

The method according to any one of the eleventh to sixteenth aspects, wherein the slurry comprises a glass powder whose softening point is lower than that of the glass woven cloth.

The Eighteenth Aspect:

The method according to any one of the eleventh to seventeenth aspects, wherein a green sheet comprising a metal oxide which cannot be sintered at a temperature of the sintering process (i.e., step (ii)) is used as the dummy green sheet.

The Nineteenth Aspect:

The method according to any one of the eleventh to eighteenth aspects, further comprising the step of removing the dummy green sheet at a point in time after the step (ii), wherein, in the removing step of the dummy green sheet, the metal oxide derived from the dummy green sheet is particularly removed.

Effect of the Present Invention

Since the core layer includes the glass-ceramic sintered body reinforced by the reinforcing material, the core layer is suitable for the enlargement of the substrate, and also the thinning of the substrate without cracking and breaking can be achieved even when the substrate has a large size. In other words, the present invention makes it possible to realize the largeness and thinning of the glass-ceramic substrate, and thus the present invention is suitable for mass-producing the modules, i.e., the present invention contributes to an improvement of the productivity.

The through-holes can be formed after the formation of the glass-ceramic sintered body. As a result, the improved positional accuracy of the through-holes is achieved even the substrate according to the present invention is a ceramic-based substrate, which will lead to a realization of the hybrid substrate with high accuracy.

Owing to the glass woven cloth serving as the reinforcing material, there can be realized the core substrate with its low dielectric constant and the improved high frequency characteristic.

The core layer precursor can be formed by an impregnation of the glass woven cloth with the glass-ceramic material. This makes it possible to provide a large sized sheet in a remarkably high-speed and inexpensive manner, compared with that of a conventional process using the doctor blade. Furthermore, the present invention, with such forming process, can provide the substrate having a large size which could not be realized by the ceramic-based substrate. Thus, the substrate according to the present invention, in spite of being ceramic based, can be treated as the printed circuit board. In view of the above point, the present invention contributes to the productivity largely.

As a result of the above-mentioned advantageous effects, the present invention can provide a further size-reduction and higher density of the electronic circuit, which will lead to an achievement of the further size-reduction and higher density of the electronic circuit module.

INDUSTRIAL APPLICABILITY

The hybrid substrate according to the present invention can be suitably used not only as a substrate for a radio RF module of a mobile device and a power LED in which heat radiation is considered, but also as a substrate for an LED backlight of a liquid crystal. The hybrid substrate of the present invention can also be suitably used as a substrate of an electronic equipment on which electronic components are mounted with a high density.

The hybrid substrate according to the present invention is suitable for the "enlargement". The build-up substrate for the semiconductor package using the large hybrid substrate according to the present invention has less warpage and high reliability with respect to thermal history. Therefore, the hybrid substrate of the present invention is especially effective as a substrate used for the semiconductor package to be mounted with the CPU semiconductor integrated circuit for a computer, a server and the like.

CROSS REFERENCE TO RELATED PATENT APPLICATION

The present application claims the right of priority of Japan patent application No. 2010-231250 (filing date: Oct. 14, 2010, title of the invention: HYBRID SUBSTRATE, PRODUCING METHOD THEREFOR, AND SEMICONDUCTOR INTEGRATED CIRCUIT PACKAGE), the whole contents of which are incorporated herein by reference.

EXPLANATION OF REFERENCE NUMERALS

10 Core layer
10' Core layer precursor (Glass-ceramic green sheet with glass woven cloth contained therein as base material)
10A, 10B Opposed surfaces of core layer
20 Glass-ceramic sintered body
20' Slurry containing a precursor component of glass-ceramic sintered body
30 Glass woven cloth
40 Through-hole
40' Through-hole precursor
41 Through-bore
50A, 50B Wiring layer provided on surface of core layer
60, 60', 60" Build-up layer
64, 64', 64" Resin layer of build-up layer
66, 66', 66" Wiring layer of build-up layer (or electrode layer)
68, 68', 68" Via hole provided in build-up layer
80 Semiconductor bare chip
85 Bump
92 Thermoset insulating resin layer
94 (94A, 94B) Wiring layer
95 Through-bore
96 Through-hole
100 Hybrid substrate
100' Hybrid substrate
200 Semiconductor integrated circuit package
200' Semiconductor integrated circuit package
250a, 250b, 250c Circuit board for semiconductor integrated circuit package
250a', 250b', 250c Circuit board for semiconductor integrated circuit package
401 Roll
402 Roll
403 Slurry container
406 Slit
407 Drying zone
409 Cutting device
410 Cut green sheet
411 Leaf green sheet
501 Roll
502 Carrier film
503 Slurry
504 Doctor blade
505 Slurry film
506 Drying zone
507 Green sheet
508 Roll
600 Dummy green sheet

The invention claimed is:

1. A method for manufacturing a hybrid substrate, comprising:

(i) impregnating a glass woven cloth with a slurry comprising a precursor component of a glass-ceramic sintered body, and thereby forming a glass-ceramic green sheet in which the glass woven cloth is contained as a base material; and (ii) subjecting the glass-ceramic green sheet to a sintering process, and thereby forming a core layer composed of the glass woven cloth and the glass-ceramic sintered body such that the glass woven cloth is contained in the whole interior of the core layer, wherein the method further comprises at least one step of forming a build-up layer on at least one side of the core layer, in which step, a build-up resin layer and a wiring layer disposed on the build-up resin layer are respectively formed, and thereafter a bore is formed in the build-up resin layer, and a via-hole is formed from the bore, wherein, during said subjecting of the glass-ceramic green sheet to the sintering process, a dummy green sheet which does not finally serve as a constituent component of the hybrid substrate is used wherein the dummy green sheet is disposed on each of opposing both sides of the glass-ceramic green sheet, and thereafter the glass-ceramic green sheet with the dummy green sheet provided thereon is subjected to the sintering process, wherein at least one through-bore is formed in the glass-ceramic green sheet at a point in time between said impregnating the glass woven cloth with the slurry and said subjecting of the glass-ceramic green sheet to the sintering process, and thereafter the through-bore is filled with an electrically conductive paste to form a through-hole precursor therefrom, and a through-hole is formed from the through-hole precursor upon performing said subjecting the glass-ceramic green sheet to the sintering process, wherein a thermoset resin layer precursor is provided on each of opposing sides of the core layer, and a metal foil is provided on the thermoset resin layer precursor, and the thermoset resin layer precursor and the metal foil are subjected to a heat treatment to form a thermoset resin layer from the thermoset resin layer precursor, and the metal foil is subjected to a patterning process to from a wiring layer from the metal foil, and wherein at least one through-bore passing through the core layer, the thermoset resin layer and the metal foil is formed at a point in time after said heat treatment, and thereafter a through-hole is formed from the through-bore.

2. The method according to claim 1, wherein the slurry comprises a glass powder whose softening point is lower than that of the glass woven cloth.

3. The method according to claim 1, wherein the dummy green sheet is a green sheet comprising a metal oxide which cannot be sintered at a temperature of the sintering process.

4. The method according to claim 3, further comprising removing the dummy green sheet at a point in time after said subjecting the glass-ceramic green sheet to a sintering process, and removing the metal oxide derived from the dummy green sheet during said removing of the dummy green sheet.

5. The method according to claim 1, wherein an electrically conductive paste is printed on each of the opposing sides of the core layer to form a wiring layer precursor, and thereafter subjecting the wiring layer precursor to a heat treatment to form a wiring layer therefrom.

\* \* \* \* \*